US011296700B1

(12) United States Patent
Rao et al.

(10) Patent No.: US 11,296,700 B1
(45) Date of Patent: Apr. 5, 2022

(54) TRIPLE MODULAR REDUNDANCY FLIP-FLOP WITH IMPROVED POWER PERFORMANCE AREA AND DESIGN FOR TESTABILITY

(71) Applicant: QUALCOMM Incorporated, San Diego, CA (US)

(72) Inventors: Hari Rao, San Diego, CA (US); Renaud Francois Henri Gelin, Del Mar, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/065,382

(22) Filed: Oct. 7, 2020

(51) Int. Cl.
*H03K 19/003* (2006.01)
*H03K 3/013* (2006.01)
*G06F 11/18* (2006.01)

(52) U.S. Cl.
CPC ..... *H03K 19/00338* (2013.01); *G06F 11/184* (2013.01); *H03K 3/013* (2013.01)

(58) Field of Classification Search
CPC ......... H03K 19/00338; H03K 19/0033; H03K 3/0372; H03K 3/3562; H03K 19/20; H03K 3/037; H03K 3/356; H03K 3/289; G06F 1/12; G06F 1/181; G06F 1/182; G06F 1/183; G06F 1/184; G06F 1/185; G06F 1/186; G06F 1/187
See application file for complete search history.

(56) References Cited

U.S. PATENT DOCUMENTS

| | | | | |
|---|---|---|---|---|
| 7,218,159 B2* | 5/2007 | Satsukawa | ............... | G11C 7/06 327/199 |
| 2002/0013928 A1 | 1/2002 | Waldie et al. | | |
| 2015/0070063 A1 | 3/2015 | Gurumurthy et al. | | |

OTHER PUBLICATIONS

Kumar C.I., et al., "High Performance Energy Efficient Radiation Hardened Latch for Low Voltage Applications", Integration, the VLSI Journal, vol. 66, Mar. 5, 2019 (Mar. 5, 2019), pp. 119-127, XP085680551, ISSN: 0167-9260, DOI: 10.1016/J.VLSI.2019.02. 004 section 2.1; p. 120; figure 2.
Partial International Search Report—PCT/US2021/047535—ISA/ EPO—dated Dec. 14, 2021.

\* cited by examiner

*Primary Examiner* — Hai L Nguyen
(74) *Attorney, Agent, or Firm* — Loza & Loza, LLP

(57) ABSTRACT

A triple modular redundancy (TMR) flip-flop includes a set of master-gate-latch circuits including a first set of inputs to receive a first digital signal, and a second set of inputs to receive a clock; and a voting logic circuit including a set of inputs coupled to a set of outputs of the set of master-gate-latch circuits, and an output to generate a second digital signal based on the first digital signal. Another TMR flip-flop includes a set of master-gate-latch circuits to receive a set of digital signals in response to a first edge of a clock, respectively; and latch the set of digital signals in response to a second edge of the clock, respectively; and a voting logic circuit to receive the latched set of digital signals; and generate a second digital signal based on a majority of logic levels of the latched first set of digital signals, respectively.

39 Claims, 13 Drawing Sheets

| DFT INPUTS | CASE-1 | CASE-2 | CASE-3 | Q |
|---|---|---|---|---|
| SFT0 | 1 | 0 | 0 | N/A |
| SFT1 | 0 | 1 | 1 | N/A |
| SFT2 | 0 | 1 | 1 | N/A |
| SIN0 / n0 | TOGGLE | 0 | 0 | TOGGLE |
| SIN1 / n1 | 0/0 | TOGGLE | 1 | TOGGLE |
| SIN2 / n2 | 0/1 | 1 | TOGGLE | TOGGLE |

TRIPLE MODULAR REDUNDANCY FLIP-FLOP WITH IMPROVED POWER PERFORMANCE AREA AND DESIGN FOR TESTABILITY

FIELD

Aspects of the present disclosure relate generally to data flip-flops, and in particular, to a triple modular redundancy flip-flop with improved power performance area (PPA) attributes and design for testability (DFT) capability.

DESCRIPTION OF RELATED ART

Data flip-flops are used in computing circuits to sequentially deliver data through various sub-circuits and combinational logic. The data retained by the flip-flops during the sequential delivery may be affected by noise, such as terrestrial radiation. For example, terrestrial radiation directed at a node of a flip-flop may cause the flip-flop to unintendedly change state or flip (e.g., from a logic one (1) to a logic zero (0), or vice-versa). This is sometimes referred to as a single event upset (SEU). If such flip-flops are employed in safety-related systems, such as automotive or avionics systems, the consequence of an unintended change in the state of one or more flip-flops (e.g., one or more SEUs) may severely compromise the safety of humans relying on such systems.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a set of master-gate-latch circuits including a first set of inputs to receive a first digital signal, and a second set of inputs to receive a clock, respectively; and a voting logic circuit including a set of inputs coupled to a set of outputs of the set of master-gate-latch circuits, respectively, and an output to generate a second digital signal based on the first digital signal.

Another aspect of the disclosure relates to an apparatus. The apparatus includes a set of master-gate-latch circuits configured to: receive a first set of digital signals in response to a first edge of a clock, respectively; and latch the first set of digital signals in response to a second edge of the clock, respectively; and a voting logic circuit configured to: receive the latched first set of digital signals; and generate a second digital signal based on a majority of logic levels of the latched first set of digital signals.

Another aspect of the disclosure relates to a method. The method includes receiving a first set of digital signals in response to a first edge of a clock, respectively; latching the first set of digital signals in response to a second edge of the clock, respectively; and generating a second digital signal based on a majority of logic levels of the latched first set of digital signals.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

Figure 1A:
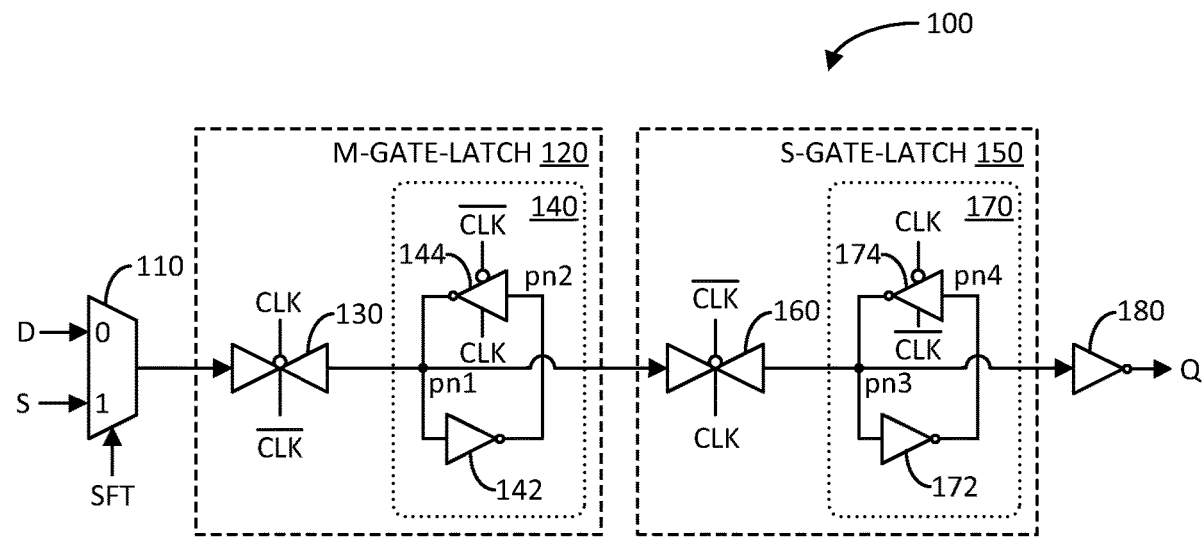
FIG. 1A illustrates a block diagram of an example flip-flop in accordance with an aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Computing systems involving safety of humans are often designed to be more fault tolerant than commercial computing systems that typically do not impact human safety. If a commercial computing system is affected by a fault due to noise, such as terrestrial radiation, the system may simply be rebooted, as there are generally no consequences to human safety. Fault-tolerant computing systems, on the other hand, are often designed to be more resilient to terrestrial radiation or noise that can change logic states at one or more critical nodes in such systems. The unwanted change in the logic state at one or more critical nodes may propagate down a chain of components, and may cause the system to function in an unwanted manner, which may result in severe injury or death to humans. As discussed further herein, the unwanted change in the logic states at one or more critical nodes may be the result of bit flips in one or more flip-flops in such systems, which is sometimes referred to as a single event upset (SEU).

Examples of fault-tolerant computing systems are Advanced Driver Assistance Systems (ADAS). These systems provide different levels of autonomous driving of automotive vehicles. For example, an ADAS level "0" system is defined as hands on/driver on, where there is no active assistance system, but provides forward collision warning (FCW), lane departure warning (LDW), and blind spot detection (BSD) warning. An ADAS level "1" system is also defined as hands on/driver on, but further provides adaptive cruise control (ACC) and lane keep assist (LKA). An ADAS level "2" system is defined as hands temporarily off/eyes temporarily off, which provides ACC with lane keeping and traffic jam assist. An ADAS level "3" system is defined as hands off/eyes off, which provides highway autopilot and traffic jam pilot. An ADAS level "4" system is defined as hands off/mind off, which provides full highway autopilot and full urban autopilot. And, an ADAS level "5" system is defined as hands off/driver off, which provides for robo-taxi/shuttles and autonomous delivery fleets.

The higher the ADAS level, the higher requirements in terms of failure in time (FIT) is generally specified. For example, the Automotive Safety Integrity Level (ASIL) has an International Organization for Standardization (ISO) 26262 that specifies FIT requirements for different applications. One (1) FIT is defined as one (1) failure in 109 (one (1) billion) hours. For instance, the ASIL A requirement, which is applicable to commercial (non-safety) applications, specifies that the FIT is to be less than or equal to 1000. The ASIL B requirement, which is applicable to automotive safety applications, specifies that the FIT is to be less than or equal to 100. ASIL C and D have more stringent FIT and other requirements.

As mentioned above, terrestrial radiation and/or other types of noise may produce bit flips in sequential circuits, such as flip-flops, which may have an adverse impact in the FIT performance for systems employing such circuits. Accordingly, it is desirable to improve the design of sequential circuits so that they can meet the FIT and other requirements required by the systems employing such sequential circuits.

FIG. 1A illustrates a schematic diagram of an example flip-flop 100 in accordance with an aspect of the disclosure. The flip-flop is configured to receive an application data signal (D) or a test scan signal (S), and generate an output digital signal Q based on the data signal (D) or the scan signal (S) in response to a clock (CLK). The flip-flop 100 may be used in sequential circuits to route the data signal (D) or scan signal (S) from one circuit to another circuit in response to the clock (CLK). As indicated, the data signal (D) may be actual data generated by an application, such as an automotive application; and the scan signal (S) may be a test pattern for testing the operation of the flip-flop 100 and/or other sequential and logic devices coupled to the flip-flop 100.

More specifically, the flip-flop 100 may include a multiplexer 110, a master-gate-latch circuit 120, a slave-gate-latch circuit 150, and an output driver 180 (e.g., an inverter). In this example, the multiplexer 110 is a 2-to-1 multiplexer, with two inputs to receive a data signal (D) and a scan signal (S), respectively. The data signal (D) may be data from an application, such as an automotive application. The scan signal (S) may be a test pattern for testing the operation of the flip-flop 100, such as in the case of a design for testability (DFT) implementation. The multiplexer 110 includes a select input to receive a shift (SFT) signal, and an output coupled to an input of the master-gate-latch circuit 120. In operation, if the shift signal is a logic low or zero (0), the multiplexer 110 outputs the data signal (D) as an input digital signal for the master-gate-latch circuit 120; and if the shift signal is a logic high or one (1), the multiplexer 110 outputs the scan signal (S) as the input digital signal for the master-gate-latch circuit 120.

The master-gate-latch circuit 120 includes a master clocked gate 130 and a master latch 140. The master clocked gate 130 is referred to as a "clocked" gate because a clock controls whether the gate passes data from its input to its output, or blocks the data from passing to its output. More specifically, the master clocked gate 130 includes a complementary control input to receive a non-complementary clock CLK and a non-complementary control input to receive a complementary clock $\overline{CLK}$. The master clocked gate 130 includes an input, which serves as the input of the master-gate-latch circuit 120, and an output coupled to a first node pn1 of the master latch 140.

The master latch 140 includes a non-clocked inverter 142 and a clocked inverter 144, which are cross coupled (e.g., the output of one is coupled to the input of the other, for both inverters). Similarly, the term "non-clocked" inverter means the inverter inverts its input signal to generate its output signal independent of a clock. Whereas, a "clocked" inverter inverts its input signal to generate its output signal dependent on a clock, e.g., only during a certain phase of the clock. More specifically, the non-clocked inverter 142 includes an input coupled to the first node pn1 of the master latch 140, and an output coupled to a second node pn2 of the master latch 140. The clocked inverter 144 includes an input coupled to the second node pn2, and an output coupled to the first node pn1. The clocked inverter 144 includes a complementary control input to receive the complementary clock $\overline{CLK}$ and a non-complementary control input to receive the non-complementary clock CLK.

The master-gate-latch circuit 120 operates as follows: if the non-complementary clock CLK and the complementary clock $\overline{CLK}$ are logic low and high, respectively, the master clocked gate 130 passes the input digital signal (the selected one of the data signal (D) or scan signal (S)) at its input to its output or node pn1 of the master latch 140; and the clocked inverter 144 of the master latch 140 is disabled (e.g., tristated), configuring the master latch 140 in transparent mode to receive the input digital signal at node pn1. If the non-complementary clock CLK and the complementary clock $\overline{CLK}$ are logic high and low, respectively, the master clocked gate 130 blocks the input digital signal from passing to its output or node pn1 of the master latch 140; and the clocked inverter 144 of the master latch 140 is enabled, configuring the master latch 140 is in opaque mode to latch the input digital signal at node pn1. The master-gate-latch circuit 120 is referred to as "edge-triggered" because the master latch 140 latches or captures the input data in response to the rising edge of the non-complementary clock CLK, and the master clocked gate 130 isolates the master latch 140 from the input to prevent the latched data to change while the non-complementary clock is at a high state.

The slave-gate-latch circuit 150 includes a slave clocked gate 160 and a slave latch 170. The slave clocked gate 160 includes an input coupled to node pn1 of the master latch 140, and an output coupled to a first node pn3 of the slave latch 170. The slave clocked gate 160 further includes a complementary control input to receive the complementary clock $\overline{CLK}$ and a non-complementary control input to receive the non-complementary clock CLK. The slave latch 170 includes a non-clocked inverter 172 and a clocked inverter 174, which are cross coupled. That is, the non-clocked inverter 172 includes an input coupled to the first node pn3 of the slave latch 170, and an output coupled to a second node pn4 of the slave latch 170. The clocked inverter 174 includes an input coupled to the second node pn4, and an output coupled to the first node pn3. The clocked inverter 174 includes a complementary control input to receive the non-complementary clock CLK and a non-complementary control input to receive the complementary clock $\overline{CLK}$.

The slave-gate-latch circuit 150 operates as follows: if the complementary clock $\overline{CLK}$ and the non-complementary clock CLK are logic low and high, respectively, the slave clocked gate 160 passes the digital signal at its input to its output or node pn3 of the slave latch 170; and the clocked inverter 174 is disabled (e.g., tristated), configuring the slave latch 170 in transparent mode to receive digital signal at node pn3. If the complementary clock $\overline{CLK}$ and the non-complementary clock CLK are logic high and low, respectively, the slave clocked gate 160 blocks the digital signal at its input from passing to its output or node pn3 of the slave latch 170; and the clocked inverter 174 is enabled, configuring the slave latch 170 is in opaque mode to latch the digital signal at node pn3. The slave-gate-latch circuit 150 is also edge-triggered because the slave latch 150 latches or captures the input data in response to the falling edge of the non-complementary clock CLK, and the slave clocked gate 160 isolates the slave latch 170 from the master-gate-latch 120 to prevent the latched data to change while the non-complementary clock is at a low state.

The output driver or inverter 180 includes an input coupled to node pn3 of the slave latch 170, and an output to produce the output data signal Q, which could be based on the data signal (D) or the scan signal (S), depending on which one is selected by the multiplexer 110. The output driver or inverter 180 ensures that the polarity of the output data signal Q is the same as the polarity of the data signal (D) or scan signal (S). That is, each of the three (odd) devices 110, 130, and 160 invert its input signal to generate its output signal. Thus, the output driver or inverter 180 performs the fourth (even) inversion in the flip-flop 100 to ensure that the polarity of output data signal Q is the same as the data signal (D) or scan signal (S).

Figure 1B:
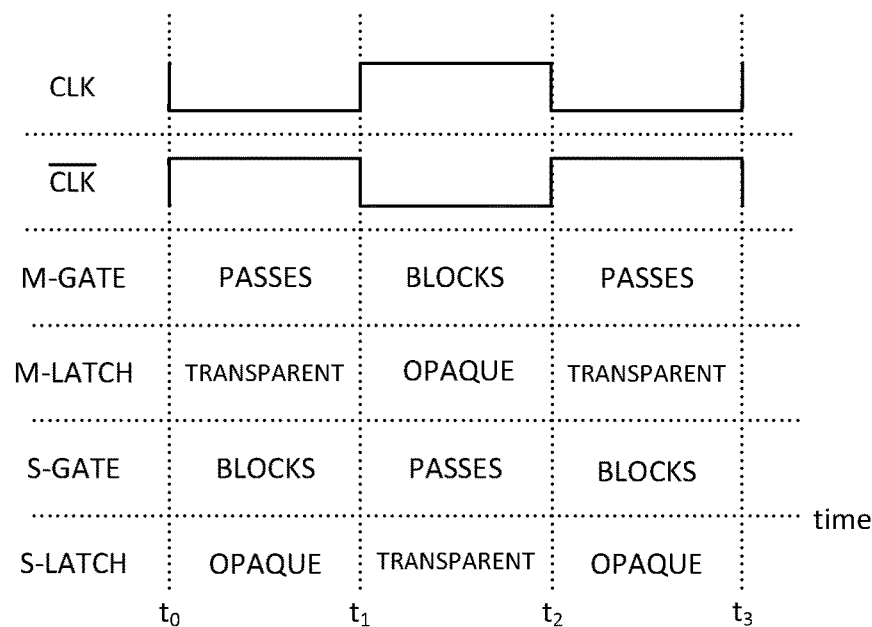
FIG. 1B illustrates a timing diagram of an example operation of the flip-flop of FIG. 1A in accordance with another aspect of the disclosure.

FIG. 1B illustrates a timing diagram of an example operation of the flip-flop 100 in accordance with another aspect of the disclosure. The x- or horizontal-axis of the timing diagram represents time. The y- or vertical axis represents, from top to bottom, the states of the non-complementary clock CLK, the complementary clock $\overline{CLK}$, the master clocked gate 130, the master latch 140, the slave clocked gate 160, and the slave latch 170. In this example, the data signal (D) is selected using the multiplexer 110 via a non-asserted shift signal SFT. However, it shall be understood that the flip-flop 100 operates in a similar manner when the scan signal (S) is selected.

The flip-flop 100 may operate as follows: Between times $t_0$ and $t_1$, the non-complementary clock CLK and the complementary clock $\overline{CLK}$ are logic low and high, respectively. Accordingly, the master clocked gate 130 passes the current input signal D(t) from the output of the multiplexer 110 to the first node pn1 of the master latch 140. The master latch 140 is in transparent mode (e.g., the clocked inverter 144 is disabled or tristated), allowing the master latch 140 to receive the current digital signal D(t). The slave clocked gate 160 blocks the current data signal D(t) so as to not disturb the slave latch 170 latching of the digital signal D(t−1). And, the slave latch 170 is in opaque mode (e.g., the clocked inverter 174 is enabled), allowing the slave latch 170 to latch the previous digital signal D(t−1). The output driver or inverter 180 inverts the previous digital signal D(t−1) to generate the previous output digital signal Q(t−1).

Between times $t_1$ and $t_2$, the non-complementary clock CLK and the complementary clock $\overline{CLK}$ are logic high and low, respectively. Accordingly, the master clocked gate 130 blocks the new input digital signal D(t+1) so as to not disturb the master latch 140 latching of the current digital signal D(t). And, the master latch 140 is in opaque mode (e.g., the clocked inverter 144 is enabled), allowing the master latch 140 to latch the current digital signal D(t). The slave clocked gate 160 passes the current digital signal D(t) from the master latch 140 to the first node pn3 of the slave latch 170. The slave latch 170 is in transparent mode (e.g., the clocked inverter 174 is disabled or tristated), allowing the slave latch 170 to receive the current digital signal D(t).

Between times $t_2$ and $t_3$, the non-complementary clock CLK and complementary clock $\overline{CLK}$ are logic low and high, respectively. Accordingly, the master clocked gate 130 passes the new digital signal D(t+1) from the output of the multiplexer 110 to the first node pn1 of the master latch 140. The master latch 140 is in transparent mode (e.g., the clocked inverter 144 is disabled or tristated), allowing the master latch 140 to receive the new digital signal D(t+1). The slave clocked gate 160 blocks the new digital signal D(t+1) so as to not disturb the slave latch 170 latching of the current digital signal D(t). And, the slave latch 170 is in opaque mode (e.g., the clocked inverter 174 is enabled), allowing the slave latch 170 to latch the current digital signal D(t). The output driver or inverter 180 inverts the current digital signal D(t) to generate the current output digital Q(t). The operation of the flip-flop 100 repeats to sequentially clock in and clock out incoming data.

Figure 2:
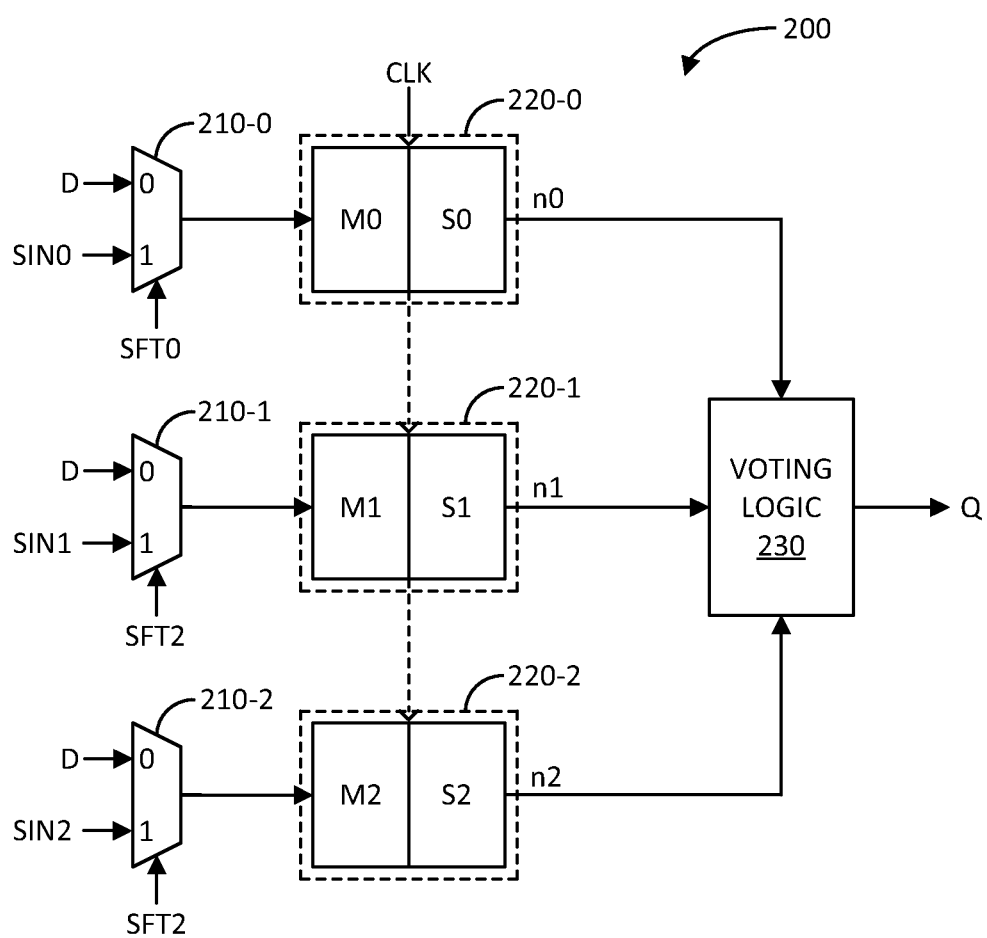
FIG. 2 illustrates a block diagram of an example triple modular redundancy (TMR) flip-flop in accordance with another aspect of the disclosure.

FIG. 2 illustrates a block diagram of an example triple modular redundancy (TMR) flip-flop 200 in accordance with another aspect of the disclosure. The TMR flip-flop 200 is more fault tolerant than the flip-flop 100 because it has a certain level of redundancy, such as, N redundant flip-flops, where N=3 in this example. The redundant flip-flops receive the same digital signals, and output separate digital signals to a majority voting logic. The majority voting logic generates an output digital signal based on a majority of the logic levels of the digital signals received from the redundant flip-flops. Accordingly, the higher degree of fault tolerant stems from the assumption that terrestrial radiation or noise is more likely to affect (e.g., produce a bit flip or SEU in) one of the redundant flip-flops and not the other ones. Thus, in such case, the majority voting logic outputs the correct digital signal.

More specifically, the TMR flip-flop 200 includes multiplexers 210-0, 210-1, and 210-2, redundant flip-flops 220-0, 220-1, and 220-2, and a voting logic circuit 230. The multiplexers 210-0, 210-1, and 210-2 include respective first inputs ("0") to receive the same input data signal (D), and respective second inputs ("1") to receive scan data signals SIN0, SIN1, and SIN2, respectively. The multiplexers 210-0, 210-1, 210-2 include select control inputs to receive shift signals SFT0, SFT1, and SFT2, respectively. The multiplexers 210-0, 210-1, and 210-2 include outputs coupled to inputs of the redundant flip-flops 220-0, 220-1, and 220-2, respectively.

Each of the redundant flip-flops 220-0, 220-1, and 220-2 may be configured per flip-flop 100 previously discussed. That is, the redundant flip-flops 220-0, 220-1, and 220-2 include master-gate-latch circuits M0, M1, and M2, and slave-gate-latch circuits S0, S1, and S2, respectively. The redundant flip-flops 220-0, 220-1, and 220-2 each receives a CLK, and may each include devices (e.g., inverters or buffer) to generate the non-complementary clock CLK and complementary clock $\overline{CLK}$ for driving the sequential operation of the flip-flops 220-0, 220-1, and 220-2, as discussed in detail with respect to flip-flop 100. The redundant flip-flops 220-0, 220-1, and 220-2 include outputs n0, n1, and n2 coupled to inputs of the voting logic circuit 230, respectively.

The voting logic circuit 230 generates an output digital signal Q based on a majority of the logic levels (e.g., logic zero (0) or logic one (1)) of the digital signals at nodes n0, n1, and n2. Consider a first example: assume that the data signal (D) is at a logic one (1), and the shift signals SFT0, SFT1, and SFT2 are all at logic zeros (0s); thereby, causing the multiplexers 210-0, 210-1, and 210-2 to output the data signal (D). In response to consecutive rise and falling edges of the clock CLK, the redundant flip-flops 220-0, 220-1, and 220-2 generate correct data signals (e.g., logic ones (1)) at nodes n0, n1, and n2. As the majority (or all, in this example) of the data signals at nodes n0, n1, and n2 are logic ones (1s), the voting logic circuit 230 generates the correct output digital signal Q as a logic one (1). This is an example of an error-free operation of the TMR flip-flop 200.

Consider a second example: assume again that the data signal (D) is at a logic one (1), and the shift signals SFT0, SFT1, and SFT2 are all at logic zeros (0s); thereby, causing the multiplexers 210-0, 210-1, and 210-2 to output the data signal (D). In response to consecutive rise and falling edges of the clock CLK, the redundant flip-flops 220-0 and 220-1 generate the correct data signals (e.g., logic ones (1)) at nodes n0 and n1, but terrestrial radiation and/or noise has produced an SEU in flip-flop 220-2, causing it to generate an incorrect data signal (e.g., a logic zero (0)) at node n2.

Again, as the majority (two out of three, in this example) of the digital signals at the nodes n0, n1, and n2 are logic ones (1s), the voting logic circuit 230 generates the correct output digital signal Q as a logic one (1). This is an example of a fault tolerant operation of the TMR flip-flop 200.

With regard to DFT, the multiplexers 210-0, 210-1, and 210-2 may be configured to receive independent scan signals SIN0, SIN1, and SIN2 to test the operation of the TMR flip-flop 200, such as to test for stuck at faults and the operations of the multiplexers 210-0, 210-1, and 210-2, redundant flip-flops 220-0, 220-1, and 220-2, and the voting logic circuit 230. A stuck at fault means that a node along a data path in the TMR flip-flop 200 is stuck at a particular logic level (e.g., at a logic one (1) or logic zero (0)).

As an example, any of the scan signals may be toggled while the other two are set to opposite logic states. In such case, if the TMR flip-flop 200 is operating error free, the output digital signal Q toggles with the toggling of the corresponding scan signal. On the other hand, if there is a stuck at fault at a node associated with the scan signal that is being toggled, the output digital signal Q does not toggle with the toggling of the corresponding scan signal; and thus, a stuck at fault may be identified.

There are some drawbacks with the TMR flip-flop 200 in terms of power performance area (PPA). For example, with regard to power, the power consumed by the clock CLK driving the redundant flip-flops 220-0, 220-1, and 220-2 may be considered relatively high, as the clock CLK has to drive three (3) master clocked gates, three (3) master latches, three (3) slave clocked gates, and three (3) slave latches. With regard to performance, the clock-to-output (C2Q) delay is six (6) stages: a multiplexer, a master clocked gate, a master latch, a slave clocked gate, a slave latch, and a voting logic circuit. With regard to area, an integrated circuit (IC) would need sufficient footprint to implement three multiplexers, three redundant flip-flops, and a voting logic circuit.

Figures 3A, 3B:
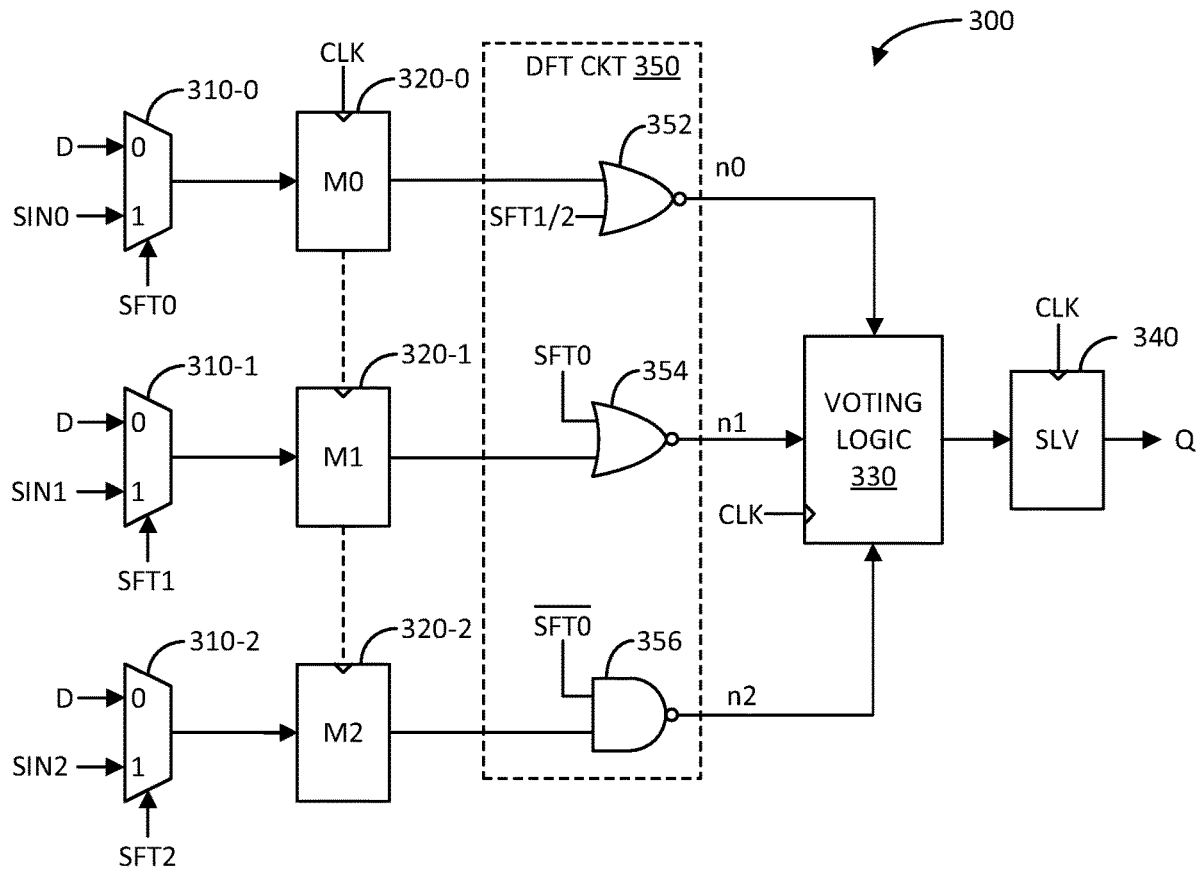
FIG. 3A illustrates a block diagram of another example triple modular redundancy (TMR) flip-flop in accordance with another aspect of the disclosure.
FIG. 3B illustrates a table related to an example design for testability (DFT) operation of the example triple modular redundancy (TMR) flip-flop of FIG. 3A in accordance with another aspect of the disclosure.

FIG. 3A illustrates a block diagram of another example triple modular redundancy (TMR) flip-flop 300 in accordance with another aspect of the disclosure. In summary, the TMR flip-flop 300 is a modification of the TMR flip-flop 200 to improve the PPA. That is, the redundant flip-flops 220-0, 220-1, and 220-2 in TMR flip-flop 200 are replaced with master-gate-latch circuits in TMR flip-flop 300, such as master-gate-latch circuit 120 of flip-flop 100. Additionally, a slave latch or slave-gate-latch circuit is added to the output of the voting logic circuit 230.

As discussed further herein, the voting logic circuit may be configured to provide a gating function, as in the slave clocked gate 160 of the flip-flop 100. In such case, a slave latch is coupled to the output of the voting logic circuit; and both may be referred to as a fused voting logic and slave latch circuit. Alternatively, the voting logic circuit may be configured to not implement the gating function. In such case, the device following the voting logic circuit is a slave-gate-latch circuit. Further, the TMR flip-flop 300 includes additional circuitry for DFT purposes. As there are two less slave-gate-latch circuits in TMR flip-flop 300 compared to TMR flip-flop 200, and the additional DFT circuit is small compared to the two less slave-gate-latch circuits, the TMR flip-flop 300 has improved PPA over the TMR flip-flop 200.

More specifically, the TMR flip-flop 300 includes a set of multiplexers 310-0, 310-1, and 310-2, a set of master-gate-latch circuits 320-0, 320-1, and 320-2, a voting logic circuit 330, a slave latch or slave-gate-latch circuit 340, and a DFT circuit 350. Similar to TMR flip-flop 200, the set of multiplexers 310-0, 310-1, and 310-2 include respective first inputs ("0") to receive the same data signal (D), and respective second inputs ("1") to receive scan signals SIN0, SIN1, and SIN2, respectively. The set of multiplexers 310-0, 310-1, 310-2 include select control inputs to receive shift signals SFT0, SFT1, and SFT2, respectively. The set of multiplexers 310-0, 310-1, and 310-2 include a set of outputs coupled to a set of inputs of the master-gate-latch circuits 320-0, 320-1, and 320-2, respectively.

Each of the set of master-gate-latch circuits 320-0, 320-1, and 320-2 may be configured per master-gate-latch circuit 120 of flip-flop 100 previously discussed. That is, each of the master-gate-latch circuits 320-0, 320-1, and 320-2 include a master clocked gate (e.g., master clocked gate 130) followed by a master latch (e.g., master latch 140). The set of master-gate-latch circuits 320-0, 320-1, and 320-2 each receives a clock CLK, and may internally generate a non-complementary clock CLK and a complementary clock $\overline{CLK}$ for driving the sequential operation of the master-gate-latch circuits 320-0, 320-1, and 320-2, as discussed in detail with respect to master-gate-latch circuit 120 of flip-flop 100.

The DFT circuit 350 includes a first NOR gate 352, a second NOR gate 354 and a NAND gate 356. The first NOR gate 352 includes a first input coupled to an output of the master-gate-latch circuit 320-0, a second input to receive shift signal SFT1 or SFT2, and an output n0 coupled to a first input of the voting logic circuit 330. The second NOR gate 354 includes a first input to receive the shift signal SFT0, a second input coupled to an output of the master-gate-latch circuit 320-1, and an output n1 coupled to a second input of the voltage logic circuit 330. The NAND gate 356 includes a first input to receive a complementary shift signal $\overline{SFT0}$, a second input coupled to an output of the master-gate-latch circuit 320-2, and an output n2 coupled to a third input of the voltage logic circuit 330.

If fused with the slave latch 340, the voting logic circuit 330 includes a clock input to receive a CLK, and may internally generate the non-complementary CLK and complementary clock $\overline{CLK}$. The voting logic circuit 330 includes an output coupled to an input of the slave latch 340. The slave latch 340 includes a clock input to receive the CLK, and internally may generate the non-complementary CLK and complementary clock $\overline{CLK}$ (such clock generating circuits may be common throughout the flip-flop 300 to avoid circuit duplication). The slave latch 340 includes an output to produce an output data signal Q. As discussed, if the voting logic circuit 330 is not fused with the slave latch 340, the voting logic circuit 330 does not receive the clock CLK, and the device 340 is a slave-gate-latch circuit performing both the gating and latching functions.

In operation, when the TMR flip-flop 300 is in functional mode (e.g., non-DFT mode), the shift signals SFT0, SFT1, and SFT2 are not asserted (e.g., at logic zeros (0s)). Accordingly, the set of multiplexers 310-0, 310-1, and 310-2 output the data signal (D). Further, in response to the shift signal SFT0 not being asserted (e.g., SFT0=logic zero (0) and $\overline{SFT0}$=logic one (1)), the NOR gate 354 inverts the data signal (D) from the output of the master-gate-latch circuit 320-1, and the NAND gate 356 inverts the data signal (D) from the output of the master-gate-latch circuit 320-2. Additionally, in response to the shift signal SFT1 or SFT2 not being asserted (e.g., SFT1/2=logic zero (0)), the NOR gate 352 inverts the data signal (D) from the output of the master-gate-latch circuit 320-0.

Similar to voting logic circuit 230, the voting logic circuit 330 generates an output digital signal Q based on a majority of the logic levels of the data signals (D) at the output nodes n0, n1, and n2 in response to the clock CLK. The voting logic circuit 330 performs a logic inversion in addition to the majority voting operation so that the output digital signal Q has the same polarity as the data signal (D). The slave latch 340 latches the output digital signal Q in response to the clock CLK.

In an alternative implementation, the TMR flip-flop 300 may not include the DFT circuit 350. In such case, the slave latch or slave-gate-latch circuit 340 may include an output inverter so that the polarity of the output digital signal Q is the same as the polarity of the input digital signals D, SIN0, SIN1, and SIN2. Alternatively, in the TMR flip-flop 300 implementation that includes the DFT circuit 350, the slave latch or slave-gate-latch circuit 340 may include two consecutive inverters (e.g., a buffer) to ensure that the polarity of the output digital signal Q is the same as the polarity of the input digital signals D, SIN0, SIN1, and SIN2.

FIG. 3B illustrates a table related to an example DFT operation of the example TMR flip-flop 300 in accordance with another aspect of the disclosure. The left column of the table represents the DFT inputs, which are, from top-to-bottom, the shift signals SFT0, SFT1, and SFT2, and the scan signals SIN0, SIN1, and SIN2 (including the digital signals at associated outputs n0, n1, and n2 of the DFT circuit 350). The second column of the table represents a first case (case-1) concerning the testing for a stuck at fault along data path "0" (multiplexer 310-0, master-gate-latch circuit 320-0, NOR gate 352, voting logic circuit 330, and slave latch 340).

The third column of the table represents a second case (case-2) concerning the testing for a stuck at fault along data path "1" (multiplexer 310-1, master-gate-latch circuit 320-1, NOR gate 354, voting logic circuit 330, and slave latch 340). The fourth column of the table represents a third case (case-3) concerning the testing for a stuck at fault along data path "2" (multiplexer 310-2, master-gate-latch circuit 320-2, NAND gate 356, voting logic circuit 330, and slave latch 340). The fifth column of the table represents the output digital signal Q.

Considering case-1, the shift signal SFT0 is asserted (e.g., at logic one (1)), and the other shift signals SFT1 and SFT2 are not asserted (e.g., at logic zeros (0s)). The shift signal SFT0 being at a logic one (1) causes the NOR gate 354 to output n1 at a logic zero (0), and the complementary shift signal $\overline{SFT0}$ being at a logic zero (0) causes the NAND gate 356 to output n2 at a logic one (1). Further, the SFT 1 or SFT2 being each at a logic zero (0) causes the NOR gate 352 to invert the data signal at the output of the master-gate-latch circuit 320-0. Also per case-1, the scan signal SIN0 is toggled, and the other scan signals SIN1 and SIN2 are "don't care" because they do not impact the testing in case-1 (e.g., may be set to logic zeros (0s)).

The shift signal SFT0 being at a logic one (1) causes the multiplexer 310-0 to output the toggling scan signal SIN0. The master-gate-latch circuit 320-0 latches the scan signal SIN0 in response to the clock CLK. If there are no stuck at faults preceding the voting logic circuit 330, node n0 toggles per the scan signal SIN0, as indicated in the table. And, if there are no stuck at faults across the entire data path "0", the output signal Q toggles as well, as indicated in the table. Pursuant to this test, the nodes n1 and n2 are at different logic levels (n1=logic zero (0) and n2=logic one (1)) so that the output signal Q toggles; otherwise it would not toggle with the toggling of the scan signal SIN0 due to the majority vote operation of the voting logic circuit 330. If node n0 and/or the output signal Q do not toggle with the toggling scan signal SIN0, this means that there is a stuck at fault in the data path "0".

Considering case-2, the shift signal SFT0 is not asserted (e.g., at logic zero (0)), and the other shift signals SFT1 and SFT2 are asserted (e.g., at logic ones (1s)). The shift signal SFT0 being a logic zero (0) causes the NOR gate 354 to operate as an inverter, and the complementary shift signal $\overline{SFT0}$ being a logic one (1) causes the NAND gate 356 to operate as an inverter. Further, the shift signal SFT 1 or SFT2 being at a logic one (1) causes the NOR gate 352 to output a logic zero (0). Also, per case-2, the scan signal SIN0 is a "don't care" because it does not impact the testing in case-2 (e.g., may be set to logic zero (0)). The scan signal SIN1 is toggled, and the scan signal SIN2 is set to a logic zero (0) to cause the NAND gate 356 to output n2 at a logic one (1).

The shift signal SFT1 being a logic one (1) causes the multiplexer 310-1 to output the toggling scan signal SIN1. The master-gate-latch circuit 320-1 latches the scan signal SIN1 in response to the clock CLK. If there are no stuck at faults preceding the voting logic circuit 330, node n1 toggles per the scan signal SIN1, as indicated in the table. And, if there are no stuck at faults across the entire data path "1", the output signal Q toggles as well, as indicated in the table. Pursuant to this test, the nodes n0 and n2 have to be different logic levels (n0=logic zero (0) and n2=logic one (1)) so that the output signal Q toggles; otherwise it would not toggle with the toggling of the scan signal SIN1 due to the majority vote operation of the voting logic circuit 330.

Considering case-3, the shift signal SFT0 is not asserted (e.g., at logic zero (0)), and the other shift signals SFT1 and SFT2 are asserted (e.g., at logic ones (1s)). The shift signal SFT0 being a logic zero (0) causes the NOR gate 354 to operate as an inverter, and the complementary shift signal $\overline{SFT0}$ being a logic one (1) causes the NAND gate 356 to also operate as an inverter. Further, the SFT 1 or SFT2 being a logic one (1) causes the NOR gate 352 to output a logic zero (0). Also, per case-3, the scan signal SIN0 is a "don't care" because it does not impact the testing in case-3 (e.g., may be set to logic zero (0)). The scan signal SIN2 is toggled, and the scan signal SIN1 is set to a logic zero (0) to cause the NOR gate 354 to output n1 at a logic one (1).

The shift signal SFT2 being at a logic one (1) causes the multiplexer 310-2 to output the toggling scan signal SIN2. The master-gate-latch circuit 320-2 latches the scan signal SIN2 in response to the clock CLK. If there are no stuck at faults preceding the voting logic circuit 330, node n2 toggles per the scan signal SIN2, as indicated in the table. And, if there are no stuck at faults across the entire data path "2", the output signal Q toggles as well, as indicated in the table. Pursuant to this test, the nodes n0 and n1 have to be different logic levels (n0=logic zero (0) and n1=logic one (1)) so that the output signal Q toggles; otherwise it would not toggle with the toggling of the scan signal SIN2 due to the majority vote operation of the voting logic circuit 330.

As alternative implementations, the input data signal (D) applied to the multiplexer 310-0 may be used in the DFT operation. For example, in one such alternative implementation, the NOR gate 352 in the DFT circuit 350 may be replaced with an inverter. In such case, the input data signal (D) may be set to a logic one (1) to set node n0 at a logic zero (0) for case-2 and case-3. In another alternative implementation, the NOR gate 352 in the DFT circuit 350 may be eliminated (e.g., the output of the master-gate-latch circuit 320 being directly coupled to the first input of the voting logic circuit 330). In such alternative implementation, an inverter may precede the "0" input or follow the output of the multiplexer 310-0 so that the polarity of the data signals (D) at nodes n0, n1, and n2 during normal (error free) operation are the same.

Figure 3C:
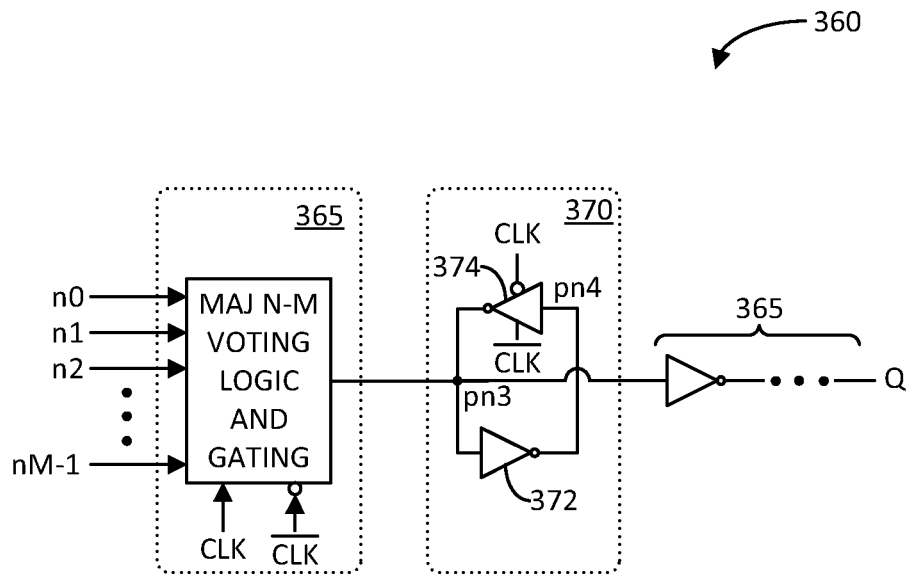
FIG. 3C illustrates a schematic diagram of an example fused voting logic and slave latch circuit in accordance with another aspect of the disclosure.

FIG. 3C illustrates a schematic diagram of an example fused voting logic and slave latch circuit 360 in accordance with another aspect of the disclosure. The fused voting logic and slave latch 360 may be an example implementation of the voting logic circuit 330 and slave latch 340 previously discussed. In summary, the fused voting logic and slave latch 360 includes a voting logic circuit that not only performs majority voting logic function, but also performs gating function similar to the slave clocked gate 160 previously discussed.

The fused voting logic and slave latch circuit 360 includes a majority N-M voting logic and gating circuit 365, a slave latch 370, and optionally a set of one or more cascaded inverters 365. The majority N-M voting logic and gating circuit 365 includes inputs coupled to nodes n0 to nM−1 at outputs of a set of M master-gate-latch circuits and/or a DFT circuit, such as master-gate-latch circuits 320-0 to 320-2 and/or DFT circuit 350, where, in that example, the integer M is equal to three (3). The majority N-M voting logic and gating circuit 365 further includes inputs to receive the non-complementary clock CLK and the complementary clock $\overline{CLK}$ for gating operation, respectively.

In operation, the majority N-M voting logic and gating circuit 365 performs majority N-M voting logic operation based on the logic levels at the M inputs, where integer N is the ceiling (e.g., rounding) of M/2. For example, if M is 3 (as in the case of voting logic circuit 330), then N is the ceiling of 3/2 or 1.5, which is two (2). If M is 5, then N is the ceiling of 5/2 or 2.5, which is three (3). If M is 7, then N is the ceiling of 7/2 or 3.5, which is four (4); and so on. The majority N-M voting operates as follows: if the majority of the logic levels (≥N) at nodes n0 to nM−1 are at a certain level (e.g., a logic one (1) or logic zero (0)), then the majority N-M voting logic and gating circuit 365 outputs that logic level in response to a rising edge of the clock (e.g., when the non-complementary and complementary clocks CLK and $\overline{CLK}$ are high and low). When the non-complementary and complementary clocks CLK and $\overline{CLK}$ are low and high, the majority N-M voting logic and gating circuit 365 is disabled or tristated, similar to slave clocked gate 160.

The slave latch 370 includes cross-coupled non-clocked inverter 372 and clocked inverter 374, similar to slave latch 170 previously discussed. The non-clocked inverter 372 includes an input coupled to node pn3, which is also coupled to the output of the majority N-M voting logic and gating circuit 365, and an output coupled to node pn4. The clocked inverter 374 includes an input coupled to node pn4 and an output coupled to pn3. Similar to slave latch 170, the clocked inverter 374 is enabled when the non-complementary and complementary clocks CLK and $\overline{CLK}$ are low and high, and disable or tristated, when non-complementary and complementary clocks CLK and $\overline{CLK}$ are high and low, respectively.

As discussed, the fused voting logic and slave latch 360 may optionally include a set of one or more cascaded inverters 365 with an input coupled to node pn3 of the slave latch 370, and an output to generate an output digital signal Q. The set of one or more cascaded inverters 365 ensures that the polarity of the output digital signal Q is the same as the input digital signals, such as D and SIN0 to SINM−1, where there is M redundancy.

Figure 3D:
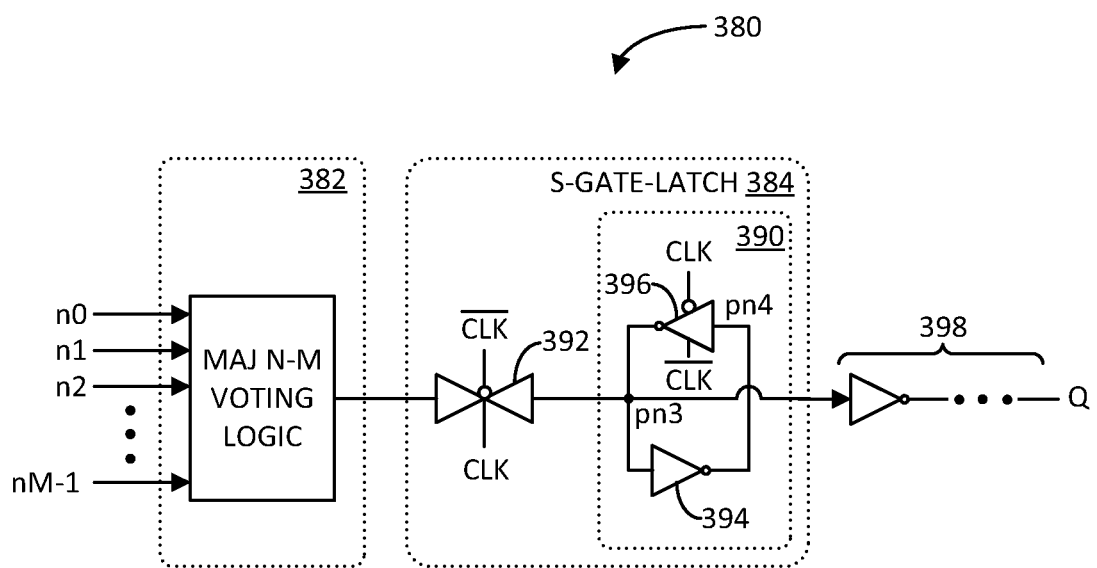
FIG. 3D illustrates a schematic diagram of an example voting logic and slave-gate-latch circuit in accordance with another aspect of the disclosure.

FIG. 3D illustrates a schematic diagram of an example voting logic and slave-gate-latch circuits 380 in accordance with another aspect of the disclosure. The voting logic and slave latch circuit 380 may be an example implementation of the voting logic circuit 330 and slave latch 340 previously discussed. In the fused voting logic and slave latch 360 previously discussed, the slave clocked gate operation was fused into the voting logic operation in the majority N-M voting logic and gating circuit 365. In voting logic and slave-gate-latch circuit 380, the slave clocked gate operation is separate from the voting logic operation.

More specifically, the voting logic and slave latch circuit 380 includes a majority N-M voting logic circuit 382, a slave-gate-latch circuit 384, and optionally one or more cascaded inverters 398. The majority N-M voting logic circuit 382 includes inputs coupled to nodes n0 to nM−1 at outputs of a set of M master-gate-latch circuits and/or a DFT circuit, such as master-gate-latch circuits 320-0 to 320-2 and/or DFT circuit 350, where, in that example, the integer M is equal to three (3).

In operation, the majority N-M voting logic circuit 382 performs majority N-M voting logic operation based on the logic levels at the M inputs, where integer N is the ceiling (e.g., rounding) of M/2. The majority N-M voting operates as follows: if the majority of the logic levels (≥N) at nodes n0 to nM−1 are at a certain level (e.g., a logic one (1) or logic zero (0)), then the majority N-M voting logic circuit 382 outputs that logic level.

The slave-gate-latch circuit 384 includes a slave clocked gate 392 and a slave latch 390. The slave clocked gate 392 includes an input coupled to an output of the majority N-M voting logic circuit 382, and an output coupled to the slave latch 390. The slave latch 390 includes inputs to receive a complementary clock $\overline{CLK}$ and non-complementary clock CLK, respectively. The slave clocked gate 392 passes a digital signal at its input to its output when the complementary and non-complementary clocks $\overline{CLK}$ and CLK are low and high, and disable or tristated, when the complementary and non-complementary clocks $\overline{CLK}$ and CLK are high and low, respectively.

The slave latch 390 includes cross-coupled non-clocked inverter 394 and clocked inverter 396, similar to slave latch 170 previously discussed. The non-clocked inverter 394 includes an input coupled to node pn3, which is also coupled to the output of the slave clocked gate 392, and an output coupled to node pn4. The clocked inverter 396 includes an input coupled to node pn4 and an output coupled to pn3. Similar to slave latch 170, the clocked inverter 396 is enabled when the non-complementary and complementary clocks CLK and $\overline{CLK}$ are low and high, and disable or tristated, when non-complementary and complementary clocks CLK and $\overline{CLK}$ are high and low, respectively.

As discussed, the voting logic and slave latch circuit 380 may optionally include a set of one or more cascaded inverters 398 with an input coupled to node pn3 of the slave latch 390, and an output to generate an output digital signal Q. The set of one or more cascaded inverters 398 ensures that the polarity of the output digital signal Q is the same as the input digital signals, such as D and SIN0 to SINM−1, where there is M redundancy.

Figure 4:
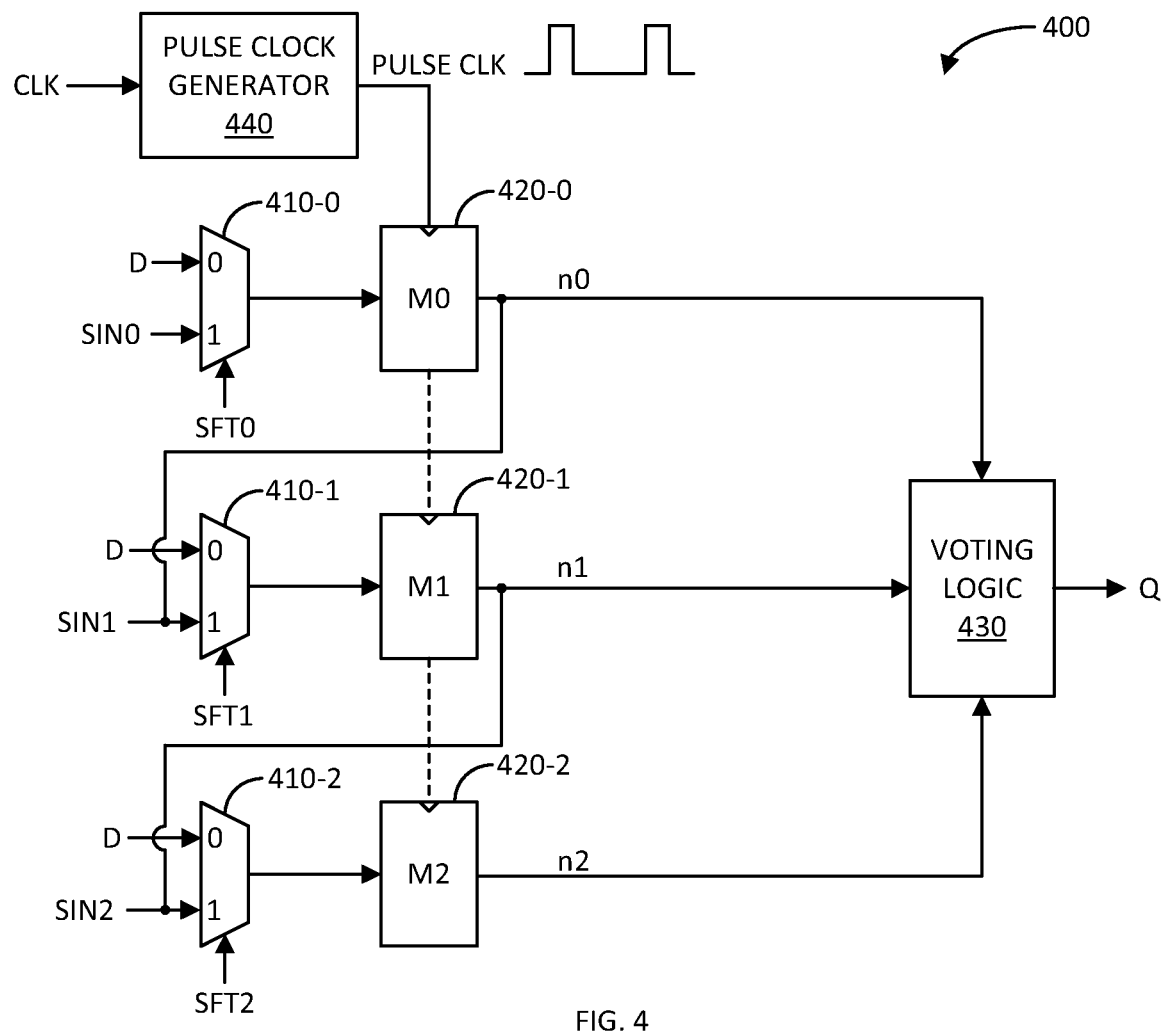
FIG. 4 illustrates a block diagram of another example triple modular redundancy (TMR) flip-flop in accordance with another aspect of the disclosure.

FIG. 4 illustrates a block diagram of another example a triple modular redundancy (TMR) flip-flop 400 in accordance with another aspect of the disclosure. In summary, the TMR flip-flop 400 is another modification of the TMR flip-flop 200 to improve the PPA. That is, the redundant flip-flops 220-0, 220-1, and 220-2 in TMR flip-flop 200 are replaced with master-gate-latch circuits in TMR flip-flop 400. Additionally, the TMR flip-flop 400 includes a pulse clock generator to generate a pulse clock for driving the master-gate latch circuits. Further, the TMR flip-flop 400 includes additional circuitry for DFT purposes. As there are no slave-gate-latch circuits in TMR flip-flop 400, the TMR flip-flop 400 has improved PPA over the TMR flip-flop 200.

More specifically, the TMR flip-flop 400 includes a set of multiplexers 410-0, 410-1, and 410-2, a set of master-gate-latch circuits 420-0, 420-1, and 420-2, a voting logic circuit 430, and a pulse clock generator 440. Similar to TMR flip-flop 200, the set of multiplexers 410-0, 410-1, and 410-2 include respective first inputs ("0") to receive the same data signal (D), and respective second inputs ("1") to receive scan signals SIN0, SIN1, and SIN2, respectively. The set of multiplexers 410-0, 410-1, 410-2 include select control inputs to receive shift signals SFT0, SFT1, and SFT2, respectively. The set of multiplexers 410-0, 410-1, and 410-2 include a set of outputs coupled to a set of inputs of the master-gate-latch circuits 420-0, 420-1, and 420-2, respectively.

Each of the master-gate-latch circuits 420-0, 420-1, and 420-2 may be configured per master-gate-latch circuit 120 of flip-flop 100 previously discussed. That is, each of the master-gate-latch circuits 420-0, 420-1, and 420-2 include a master clocked gate (e.g., master clocked gate 130) followed by a master latch (e.g., master latch 140). The master-gate-latch circuits 420-0, 420-1, and 420-2 each receives a pulse clock PCLK generated by the pulse clock generator 440, and may each include circuitry to generate non-complementary and complementary clocks PCLK and $\overline{PCLK}$ for driving the sequential operation of the master-gate-latch circuits 420-0, 420-1, and 420-2, as discussed in detail with respect to master-gate-latch circuit 120 of flip-flop 100. The set of master-gate-latch circuits 420-0, 420-1, and 420-2 include a set of outputs n0, n1, and n2 coupled to a set of inputs of the voting logic circuit 430, respectively. The voting logic circuit 430 includes an output to generate an output digital signal Q.

The pulse clock generator 440 receives, for example, a substantially 50 percent duty cycle clock CLK, and generates therefrom the pulse clock PCLK, which has a duty cycle of less than 50 percent (e.g., 20-30 percent). As the master-latch-gate circuits 420-0, 420-1, and 420-2 do not have slave-gate-latch circuits to protect their output data signals from noise, there may be a more stringent hold time requirement for the master-latch-gate circuits 420-0, 420-1, and 420-2. Accordingly, the smaller duty cycle of the pulse clock PCLK provides more margin for the hold time as would a 50 percent duty cycle clock CLK. Additionally, the clock power associated with the pulse clock PCLK is less than the clock power associated with a 50 percent duty cycle clock CLK.

For DFT purposes, the TMR flip-flop 400 may be configured to provide a DFT scan chain. For example, the output of the master-gate-latch circuit 420-0 may be coupled to input "1" of multiplexer 410-1, and the output of the master-gate-latch circuit 420-1 may be coupled to input "1" of multiplexer 410-2. Accordingly, a sequential test pattern may be introduced into input "1" of multiplexer 410-0, and with the shift signals SFT0, SFT1, and SFT2 all being asserted (e.g., at logic ones (1s)), the bits of the sequential test pattern, in response to the pulse clock PCLK, propagate from multiplexer 410-0, master-gate-latch circuit 420-0, multiplexer 410-1, master-gate-latch circuit 420-1, and multiplexer 410-2, and master-gate-latch circuit 420-2 to provide different values into the voting logic circuit 430 and test the operation of the TMR flip-flop 400 by examining the output digital signal Q, as well as the logic states at nodes n0, n1, and n2.

In functional mode, the shift signals SFT0, SFT1, and SFT2 are not asserted (e.g., at logic zeros (0s)). Accordingly, the multiplexers 410-0, 410-1, and 410-2 output the input data signal (D). In response to the pulse clock PCLK, the master-gate-latches 420-0, 420-1, and 420-2 latch the data signals (D) at nodes n0, n1, and n2, respectively. The voting logic circuit 430 generates an output data signal Q based on a majority of the logic levels of the latched data signals (D) at the outputs n0, n1, and n2.

Figure 5:
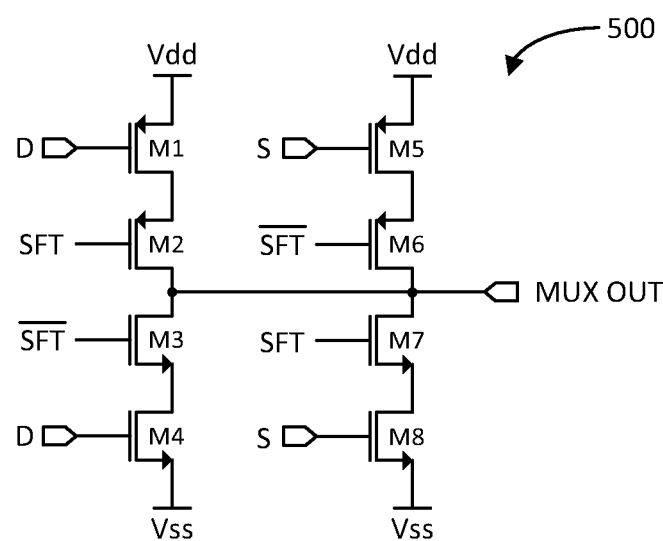
FIG. 5 illustrates a schematic diagram of an example multiplexer in accordance with another aspect of the disclosure.

FIG. 5 illustrates a schematic diagram of an example multiplexer 500 in accordance with another aspect of the disclosure. The multiplexer 500 is an example implementation of any of the multiplexers 110, 210-0, 210-1, 210-2, 310-0, 310-1, 310-2, 410-0, 410-1, and 410-2 previously discussed. The multiplexer 500 may serve as the input signal source for master-gate-latch circuits discussed further herein.

More specifically, the multiplexer 500 includes a first p-channel metal oxide semiconductor field effect transistor (PMOS FET) M1 and a second PMOS FET M2 coupled in series in that order between an upper voltage rail Vdd and an output (MUX OUT) of the multiplexer 500. The multiplexer 500 further includes a first n-channel metal oxide semiconductor field effect transistor (NMOS FET) M3 and a second NMOS FET M4 coupled in series in that order between the output of the multiplexer 500 and a lower voltage rail Vss (e.g., ground). The first PMOS FET M1 and the second NMOS FET M4 include gates to receive the data signal D. The second PMOS FET M2 and the first NMOS FET M3 include gates to receive non-complementary and complementary shift signals SFT and $\overline{\text{SFT}}$, respectively.

The multiplexer 500 further includes a third PMOS FET M5 and a fourth PMOS FET M6 coupled in series in that order between the upper voltage rail Vdd and the output of the multiplexer 500. Additionally, the multiplexer 500 includes a third NMOS FET M7 and a fourth NMOS FET M8 coupled in series between the output of the multiplexer 500 and the lower voltage rail Vss. The third PMOS FET M5 and the fourth NMOS FET M8 include gates to receive the scan signal S. The fourth PMOS FET M6 and the third NMOS FET M7 include gates to receive the complementary and non-complementary shift signals $\overline{\text{SFT}}$ and SFT, respectively.

In operation, if the shift signal is not asserted (SFT and $\overline{\text{SFT}}$ being logic low (zero (0)) and high (one (1)), respectively), the PMOS FET M2 and NMOS FET M3 are turned on, and the PMOS FET M6 and the NMOS FET M7 are turned off. Accordingly, the turned-on PMOS FET M2 and NMOS FET M3 pass the data signal (D) to the multiplexer output, and the turned-off PMOS FET M6 and the NMOS FET M7 block the scan signal (S) from the multiplexer output. Thus, the multiplexer 500 selects the data signal (D) when the shift signal is not asserted.

If the shift signal is asserted (SFT and $\overline{\text{SFT}}$ being logic high and low, respectively), the PMOS FET M2 and NMOS FET M3 are turned off, and the PMOS FET M6 and the NMOS FET M7 are turned on. Accordingly, the turned-on PMOS FET M6 and NMOS FET M7 pass the scan signal (S) to the multiplexer output, and the turned-off PMOS FET M2 and the NMOS FET M3 block the data signal (D) from the multiplexer output. Thus, the multiplexer 500 selects the scan signal (S) when the shift signal is asserted.

Figure 6:
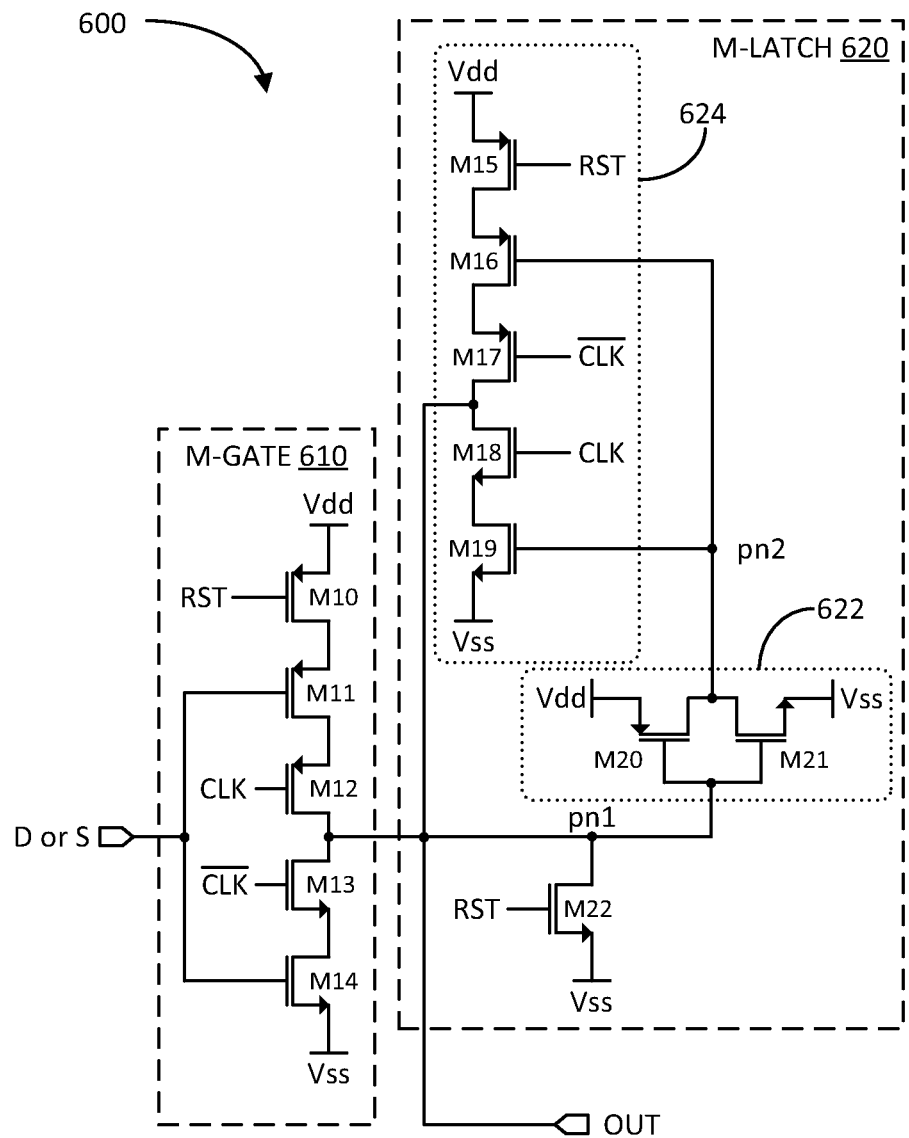
FIG. 6 illustrates a schematic diagram of an example master-gate-latch circuit in accordance with another aspect of the disclosure.

FIG. 6 illustrates a schematic diagram of an example master-gate-latch circuit 600 in accordance with another aspect of the disclosure. The master-gate-latch circuit 600 is an example implementation of any of the master-gate-latch circuits 120, 320-0, 320-1, 320-2, 420-0, 420-1, and 420-2 previously discussed.

The master-gate-latch circuit 600 includes a master clocked gate 610 (M-Gate) and a master latch 620 (M-Latch). The master clocked gate 610 receives an input digital signal (D or S), and selectively passes the input digital signal to the master latch 620 in response to a clock (CLK) and a reset signal (RST). The master clocked gate 610 includes PMOS FETs M10-M12 coupled in series in that order between an upper voltage rail Vdd and an output of the master clocked gate 610. The master clocked gate 610 further includes NMOS FETs M13-M14 coupled in series in that order between the output and a lower voltage rail Vss (e.g., ground). The PMOS FET M11 and NMOS FET M14 include gates to receive the input digital signal, the PMOS FET M10 includes a gate to receive a reset signal RST, and the PMOS FET M12 and NMOS FET M13 include gates to receive the non-complementary clock CLK and the complementary clock $\overline{\text{CLK}}$, respectively.

When the reset signal RST is not asserted (RST is at a logic low (e.g., at Vss)), the master clocked gate 610 is enabled. When enabled, if the non-complementary clock CLK and complementary clock $\overline{\text{CLK}}$ are logic low and high, the PMOS FET M12 and NMOS FET M13 are turned on, respectively. Thus, the master clocked gate 610 passes the input digital signal to the master latch 620. If the non-complementary clock CLK and complementary clock $\overline{\text{CLK}}$ are logic high and low, the PMOS FET M12 and NMOS FET M13 are turned off, respectively. Thus, the master clocked gate 610 blocks the input digital signal from passing to the master latch 620. When the reset signal RST is asserted (RST is at a logic high (e.g., at Vdd)), the master clocked gate 610 is disabled.

The master latch 620 selectively latches the input digital signal received from the master clocked gate 610 in response to the clock CLK and the reset signal RST. The master latch 620 includes cross-coupled non-clocked inverter 622 and clocked inverter 624. The non-clocked inverter 622 includes PMOS FET M20 and NMOS FET M21 coupled in series in that order between the upper voltage rail Vdd and the lower voltage rail Vss. The PMOS FET M20 and NMOS FET M21 include gates coupled together at a first node pn1 of the master latch 620. The PMOS FET M20 and NMOS FET M21 include drains coupled together at a second node pn2 of the master latch 620.

The clocked inverter 624 includes PMOS FETs M15-M17 coupled in series in that order between the upper voltage rail Vdd and node pn1, and NMOS FETs M18-M19 coupled in series in that order between node pn1 and the lower voltage rail Vss. The PMOS FET M15 includes a gate to receive the reset signal RST, the PMOS FET M16 and NMOS FET M19 include gates coupled to node pn2, and the PMOS FET M17 and NMOS FET M18 include gates to receive the complementary clock $\overline{\text{CLK}}$ and the non-complementary clock CLK, respectively. The master latch 620 also includes an NMOS FET M22 coupled between node pn1 and the lower voltage rail Vss, with a gate to receive the reset signal RST.

When the reset signal RST is not asserted (RST is at logic low (e.g., Vss)), the PMOS FET M15 and NMOS FET M22 are turned on and off, respectively; thereby, enabling the master latch 620. When enabled, if the complementary clock $\overline{\text{CLK}}$ and the non-complementary clock CLK are low and high, the PMOS FET M17 and NMOS FET M18 are turned on, respectively. Thus, the master latch 620 latches the input digital signal at node pn1, and is said to be in opaque mode. If the complementary clock $\overline{\text{CLK}}$ and the non-complementary clock CLK are high and low, the PMOS FET M17 and NMOS FET M18 are turned off, respectively. Thus, the clocked inverter 624 is disabled (e.g., tristated); and consequently, the master latch 620 is in transparent mode, able to receive a new data or scan bit. When the reset signal RST is asserted (RST is at a logic high (e.g., at Vdd)), the PMOS FET M15 and NMOS FET M22 are turned off and on, respectively; thereby, disabling the master latch 620. The first node pn1 of the master latch 620 may serve as the output of the master-gate-latch circuit 600.

Figure 7:
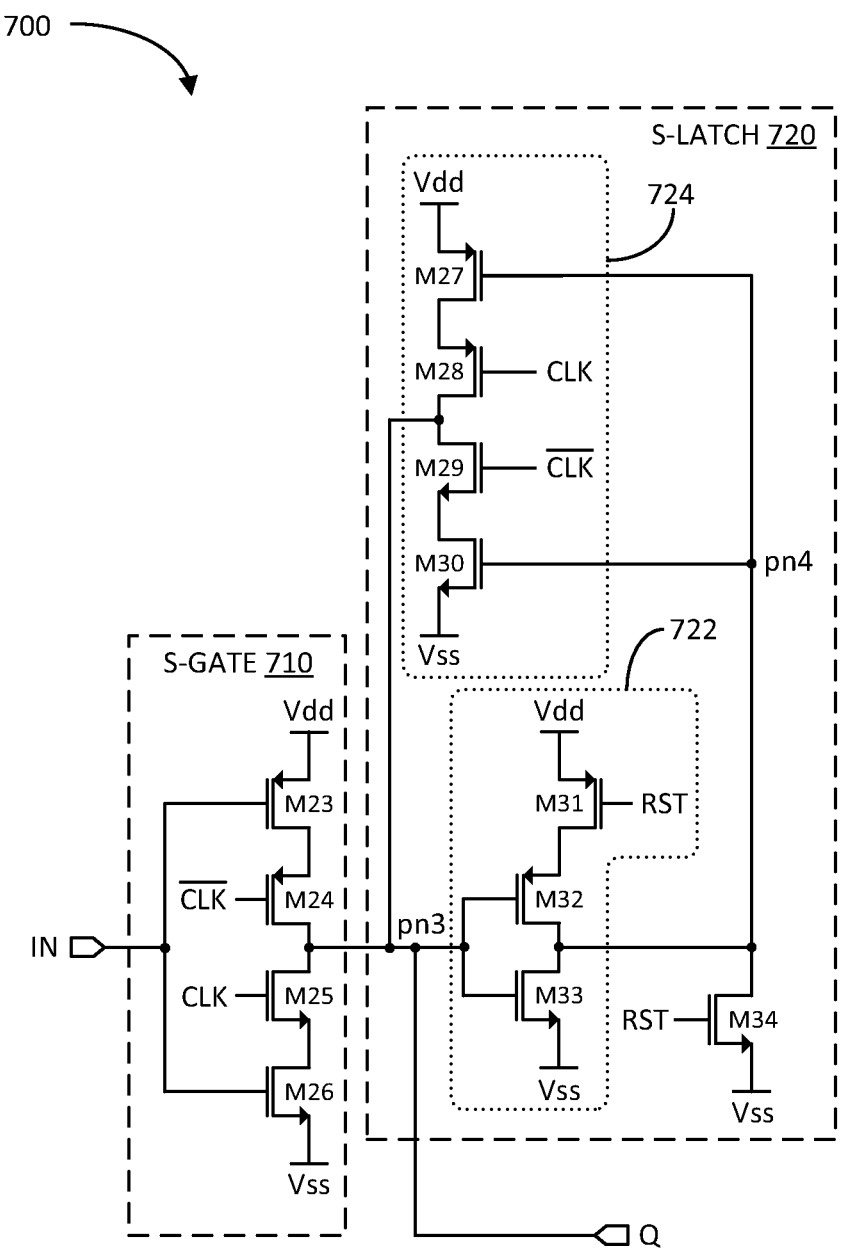
FIG. 7 illustrates a schematic diagram of an example slave-gate-latch circuit in accordance with another aspect of the disclosure.

FIG. 7 illustrates a schematic diagram of another example slave-gate-latch circuit 700 in accordance with another aspect of the disclosure. The slave-gate-latch circuit 700 is an example implementation of any of the slave-gate-latch circuits 150 and 340 (when not fused with a voting logic circuit) previously discussed. The slave-gate-latch circuit 700 includes a slave clocked gate 710 and a slave latch 720.

The slave clocked gate 710 receives a digital signal (D or S) from the voting logic circuit 330 and selectively passes the digital signal to the slave latch 720 in response to the clock CLK. The slave clocked gate 710 includes PMOS FETs M23-M24 coupled in series in that order between the upper voltage rail Vdd and an output of the slave clocked gate 710. The slave clocked gate 710 further includes NMOS FETs M25-M26 coupled in series in that order between the output of the slave clocked gate 710 and the lower voltage rail Vss. The PMOS FET M23 and NMOS FET M26 include gates to receive the digital signal from the voting logic circuit 330, and the PMOS FET M24 and NMOS FET M25 include gates to receive the complementary clock $\overline{CLK}$ and the non-complementary clock CLK, respectively.

If the complementary clock $\overline{CLK}$ and the clock CLK are low and high, the PMOS FET M24 and NMOS FET M33 are turned on, respectively. Thus, the slave clocked gate 710 passes the digital signal to the slave latch 720. If the complementary clock $\overline{CLK}$ and the non-complementary clock CLK are high and low, the PMOS FET M24 and NMOS FET M25 are turned off, respectively. Thus, the slave clocked gate 710 blocks the digital signal from passing to the slave latch 720.

The slave latch 720 selectively latches the digital signal received from the slave clocked gate 710 in response to the clock CLK and the reset signal RST. The slave latch 720 includes cross-coupled non-clocked inverter 722 and clocked inverter 724. The non-clocked inverter 722 includes PMOS FETs M31-M32 coupled in series in that order between the upper voltage rail Vdd and a node pn4 of the slave latch 720. The non-clocked inverter 722 further includes an NMOS FET M33 coupled between the node pn4 and the lower voltage rail Vss. The PMOS FET M31 includes a gate to receive the reset signal RST. The PMOS FET M32 and NMOS FET M33 include gates coupled together at another node pn3 of the slave latch 720. The output of the slave clocked gate 710 is coupled to node pn3 of the slave latch 720.

The clocked inverter 724 includes PMOS FETs M27-M28 coupled in series in that order between the upper voltage rail Vdd and node pn3, and NMOS FETs M29-M30 coupled in series in that order between node pn3 and the lower voltage rail Vss. The PMOS FET M27 and NMOS FET M30 include gates coupled to node pn4, and the PMOS FET M28 and NMOS FET M29 include gates to receive the non-complementary clock CLK and the complementary clock $\overline{CLK}$, respectively. The slave latch 720 also includes an NMOS FET M34 coupled between node pn4 and the lower voltage rail Vss, including a gate to receive the reset signal RST.

When the reset signal RST is not asserted (RST is logic low (e.g., Vss)), the PMOS FET M31 and NMOS FET M34 are turned on and off, respectively; thereby, enabling the slave latch 720. When enabled, if the non-complementary clock CLK and complementary clock $\overline{CLK}$ are low and high, the PMOS FET M28 and NMOS FET M29 are turned on, respectively. Thus, the slave latch 720 latches the digital signal at node pn3, and is said to be in opaque mode. If the non-complementary clock CLK and complementary clock $\overline{CLK}$ are high and low, the PMOS FET M28 and NMOS FET M29 are turned off, respectively. Thus, the slave latch 720 is in transparent mode, and able to receive a new data or scan bit. When the reset signal RST is asserted (RST is at a logic high (e.g., at Vdd)), the PMOS FET M31 and NMOS FET M34 are turned off and on, respectively; thereby, disabling the slave latch 720. An output data signal Q is generated at node pn3 of the slave latch 720.

Figure 8:
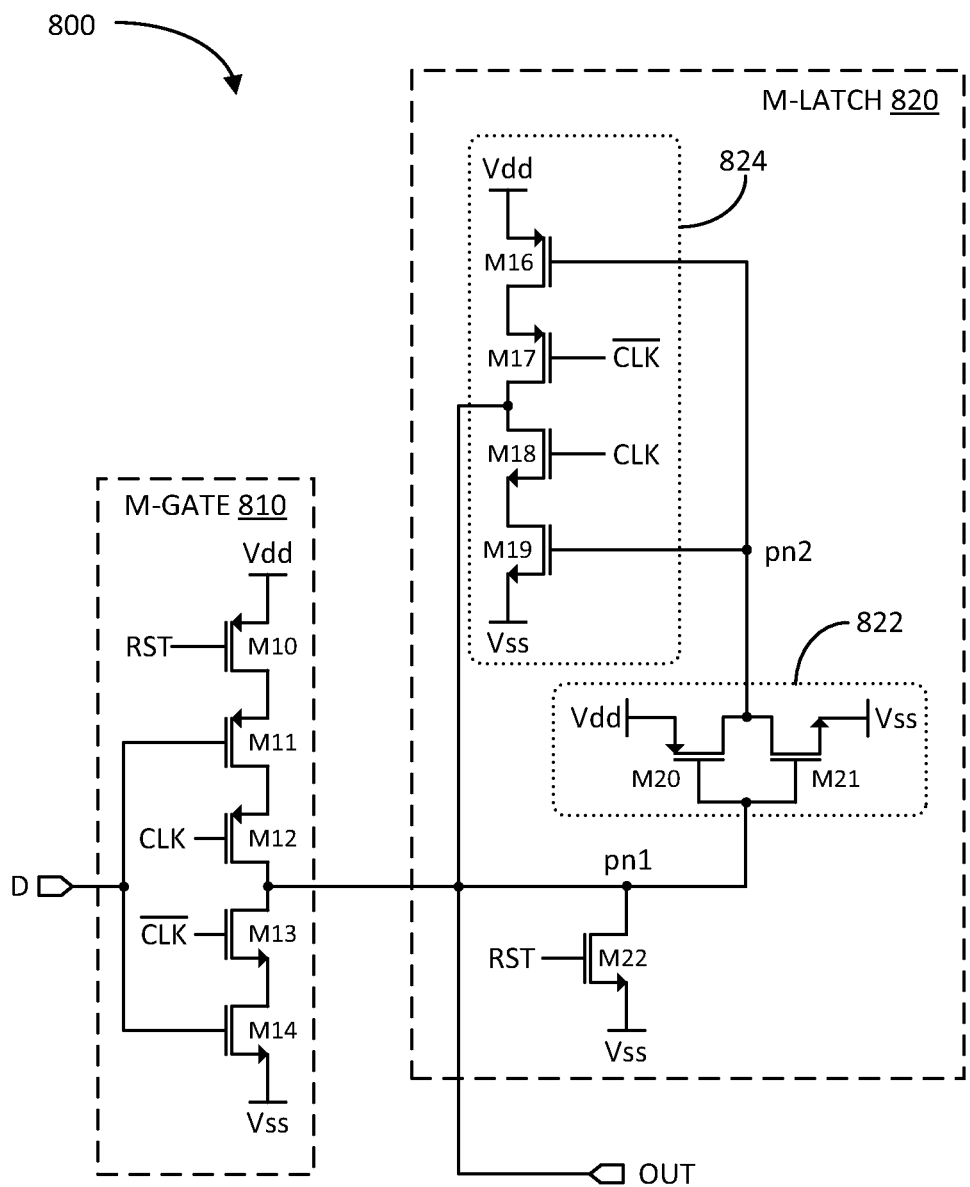
FIG. 8 illustrates a schematic diagram of another example master-gate-latch circuit in accordance with another aspect of the disclosure.

FIG. 8 illustrates a schematic diagram of another example master-gate-latch circuit 800 in accordance with another aspect of the disclosure. The master-gate-latch circuit 800 is another example implementation of any of the master-gate-latch circuits 120, 320-0, 320-1, 320-2, 420-0, 420-1, and 420-2 previously discussed.

In master-gate-latch circuit 600, the transistor turn-on resistances between nodes pn1 and pn2 and the upper and lower voltage rails Vdd and Vss in the master latch 620 differ because there are different numbers of transistors between the nodes and the voltage rails, and the transistors are sized substantially the same (e.g., they each have substantially the same turn-on resistance). For example, there are three (3) transistors between node pn1 and the upper voltage rail Vdd, namely PMOS FETs M15, M16, and M17. There are two (2) transistors between node pn1 and the lower voltage rail Vss, namely NMOS FETs M18 and M19. There is one (1) transistor between node pn2 and the upper voltage rail Vdd, namely PMOS FET M20. There is one (1) transistor between node pn2 and the lower voltage rail Vss, namely NMOS FET M21.

The tolerance to radiation that may result in an SEU depends inversely to the turn-on resistance $R_{ON}$ between the node and the voltage rail. If the turn-on resistance $R_{ON}$ of one such transistor is defined as R, the turn-on resistance $R_{ON}$ between node pn1 and Vdd is 3R, the turn-on resistance $R_{ON}$ between node pn1 and Vss is 2R, the turn-on resistance $R_{ON}$ between node pn2 and Vdd is R, and the turn-on resistance $R_{ON}$ between node pn2 and Vss is R. The fault tolerant of the master latch 620 is related to the fault tolerant of its weakest node; in this example, node pn1. Accordingly, a technique to improve the fault tolerant of a master latch is to substantially balance the turn-on resistances $R_{ON}$ between the nodes and the voltage rails. The master-gate-latch circuit 800 achieves this attribute.

The master-gate-latch circuit 800 includes a master latch 820 that is reconfigured to balance the turn-on resistances $R_{ON}$ between the nodes pn1-pn4 and the voltage rails Vdd and Vss, respectively; so that they have substantially the same tolerance to radiation or noise. The master-gate-latch circuit 800 further includes a master clocked gate 810 that is essentially the same as the master clocked gate 610.

With regard to the master latch 820, the reset PMOS FET M15 has been removed from a clocked inverter 824 of the master latch 820. Additionally, the size or effective channel width to length ratio (W/L) of each of PMOS FETs M16-M17 and NMOS FETs M18-M19 in the clocked inverter 824 is substantially different than (e.g., about two times) the size or effective W/L of each of PMOS FET M20 and NMOS FET M21 in a non-clocked inverter 822 of master latch 820. The effective W/L depends on the structure of the FET. For planar FETs, the effective W/L is related to the width of the gate electrode over the channel, and the channel length is related to the distance between the source and drain via the channel. For FIN FETs, the effective channel width is related to the width of each FIN, the height of each FIN, and the number of FINs in a FET, and the channel length is related to the distance between the source and drain via the channel. For gate all around (GAA) FETs, the effective W/L has a different formulation. The turn-on resistance $R_{ON}$ of a FET is inversely related to the effective W/L.

Accordingly, in the current example, the turn-on resistance $R_{ON}$ of each of the PMOS FETs M16-M17 and NMOS FETs M18-M19 is 0.5R, and the turn-on resistance $R_{ON}$ of each of PMOS FET M20 and NMOS FET M21 is R. Thus, the turn-on resistance $R_{ON}$ between node pn1 and the upper voltage rail Vdd and the lower voltage rail Vss is 2*0.5R or R, respectively; and the turn-on resistance $R_{ON}$ between node pn2 and upper voltage rail Vdd and the lower voltage rail Vss is also R, respectively. Thus, the turn-on resistances $R_{ON}$ between nodes pn1 and pn2 and the voltage rails are balanced; thereby, the nodes pn1 and pn2 have substantially the same tolerance to radiation or noise.

Figure 9:
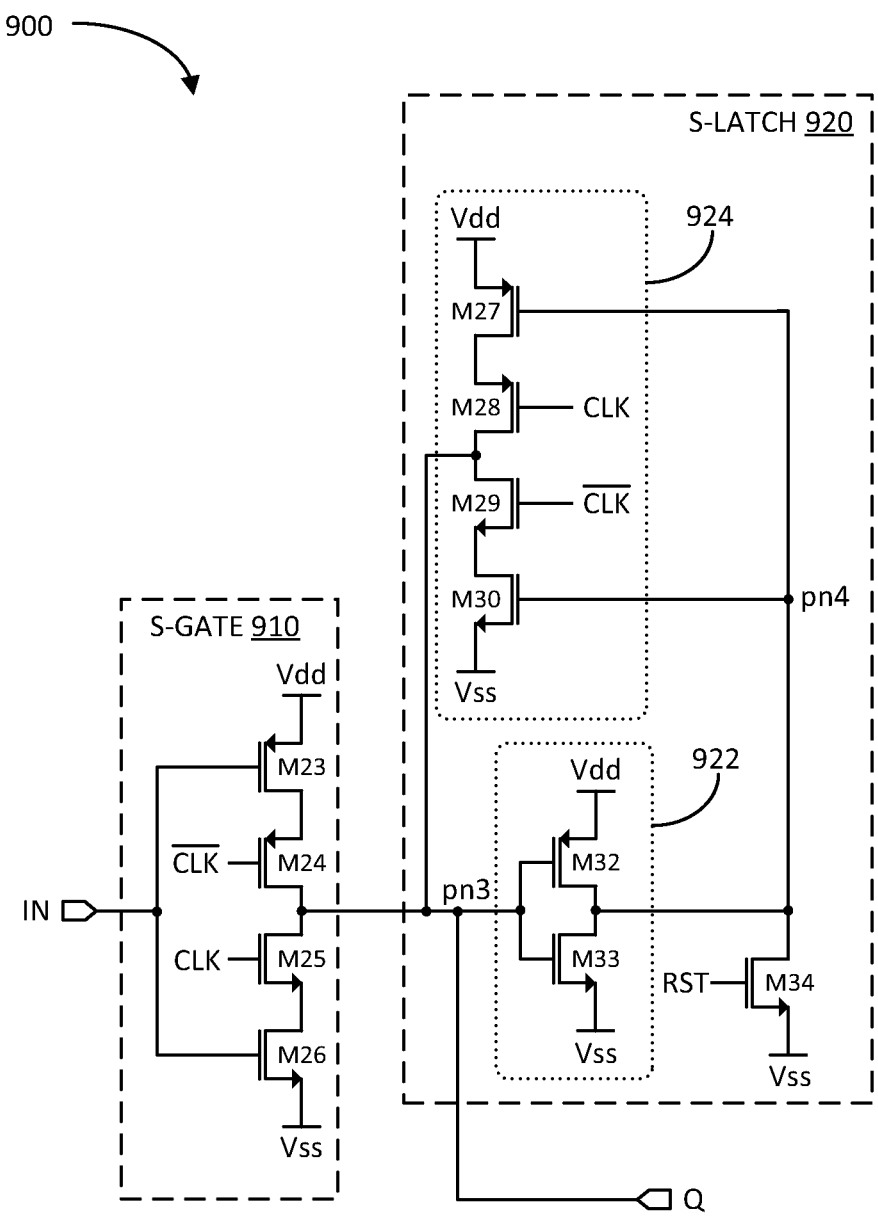
FIG. 9 illustrates a schematic diagram of another example slave-gate-latch circuit in accordance with another aspect of the disclosure.

FIG. 9 illustrates a schematic diagram of another example slave-gate-latch circuit 900 in accordance with another aspect of the disclosure. The slave-gate-latch circuit 900 is an example implementation of any of the slave-gate-latch circuits 150 and 340 previously discussed. Similar to the master-gate-latch circuit 800, the slave-gate-latch circuit 900 is configured to achieve substantially balanced turn-on resistances $R_{ON}$ between its nodes and the voltage rails, respectively.

The slave-gate-latch circuit 900 includes a slave clocked gate 910 and a slave latch 920. The slave clocked gate 910 may be configured per slave clocked gate 710 previously discussed. The slave latch 920 includes a non-clocked inverter 922 including PMOS FET M32 and NMOS FET M33, and a clocked inverter 924 including PMOS FETs M27-M28 and NMOS FETs M29-M30, as previously discussed.

Similar to the master latch 820, the reset PMOS FET M31 has been removed in the non-clocked inverter 922 of the slave latch 920. Additionally, the size or effective W/L of each of PMOS FETs M27-M28 and NMOS FETs M29-M30 of the clocked inverter 924 is substantially two times to the size or effective W/L of each of PMOS FET M32 and NMOS FET M33 of the non-clocked inverter 922 of the slave latch 920. Accordingly, the turn-on resistance $R_{ON}$ of each of the PMOS FETs M27-M28 and NMOS FETs M29-M30 is 0.5R, and the turn-on resistance $R_{ON}$ of each of PMOS FET M32 and NMOS FET M33 is R. Thus, the turn-on resistance $R_{ON}$ between node pn3 and the upper voltage rail Vdd and lower voltage rail Vss is 2*0.5R or R, respectively; and the turn-on resistance $R_{ON}$ between node pn4 and the upper voltage rail Vdd and the lower voltage rail Vss is also R, respectively. Thus, the turn-on resistances $R_{ON}$ between nodes pn3 and pn4 and the voltage rails are balanced; thereby, the nodes pn3 and pn4 have substantially the same tolerance to radiation or noise.

With regard to both the master-gate-latch circuit 800 and the slave-gate-latch circuit 900, it shall be understood that the number of transistors and their effective W/Ls in each of the non-clocked inverters 822 and 922 and clocked inverters 824 and 924 can vary in other implementations, while still achieving turn-on resistances $R_{ON}$ between nodes pn1 to pn4 and the voltage rails that are substantially balanced; as the circuits 800 and 900 are merely one example of achieving the balanced turn-on resistances $R_{ON}$.

Figure 10:
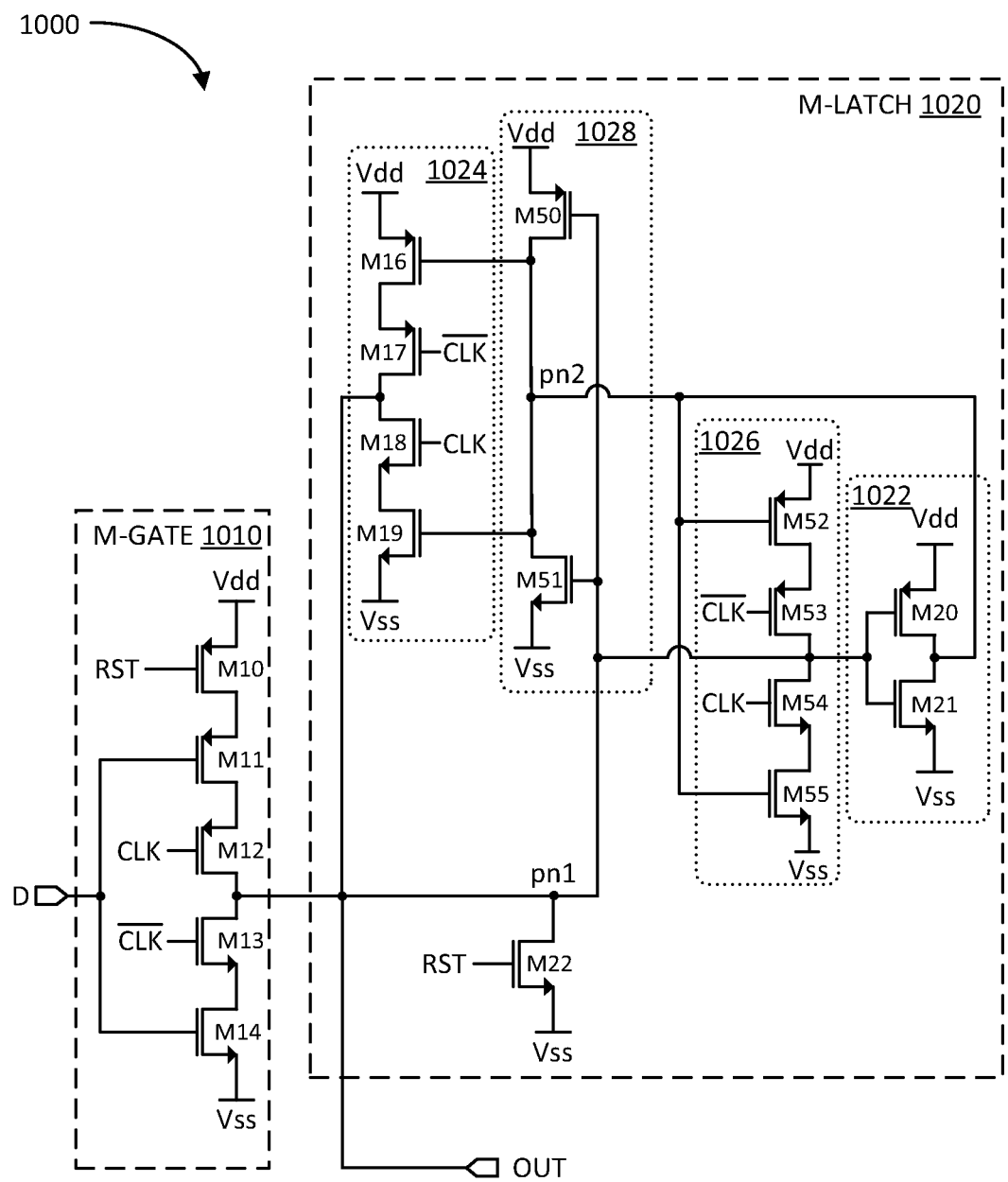
FIG. 10 illustrates a schematic diagram of another example master-gate-latch circuit in accordance with another aspect of the disclosure.

FIG. 10 illustrates a schematic diagram of another example master-gate-latch circuit 1000 in accordance with another aspect of the disclosure. The master-gate-latch circuit 1000 is an example implementation of any of the master-gate-latch circuits 120, 320-0, 320-1, 320-2, 420-0, 420-1, and 420-2 previously discussed.

The master-gate-latch circuit 1000 includes a master clocked gate 1010, which is essentially the same as the master clocked gates 610 and 810 previously discussed. The master-gate-latch circuit 1000 further includes a master latch 1020 that is configured to provide substantially balanced transistor turn-on resistances $R_{ON}$ between its internal nodes and the voltage rails, but also include negative feedback circuits for the internal nodes to further protect against SEUs due to terrestrial radiation and/or other noise.

The master latch 1020 includes cross-coupled non-clocked inverter 1022 and clocked inverter 1024, which may be configured per cross-coupled non-clocked inverter 622 or 822 and clocked inverter 624 or 824 of master latches 620 or 820, respectively. Regarding negative feedback, the master latch 1020 includes a negative feedback circuit 1026 including an input coupled to node pn2 and an output coupled to node pn1. More specifically, the negative feedback circuit 1026 includes PMOS FETs M52-M53 coupled in series in that order between the upper voltage rail Vdd and node pn1, and NMOS FETs M54-M55 coupled in series in that order between node pn1 and the lower voltage rail Vss. The PMOS FET M52 and NMOS FET M55 include gates coupled to node pn2 for negative feedback purposes, and the PMOS FET M53 and NMOS FET M54 include gates to receive the complementary clock $\overline{CLK}$ and the non-complementary clock CLK for gating the negative feedback, respectively.

The master latch 1020 further includes a negative feedback circuit 1028 including an input coupled to node pn1 and an output coupled to node pn2. More specifically, the negative feedback circuit 1028 includes a PMOS FET M50 coupled between the upper voltage rail Vdd and node pn2, and an NMOS FET M51 coupled between node pn2 and the lower voltage rail Vss. The PMOS FET M50 and NMOS FET M51 include gates coupled to node pn1 for negative feedback purposes.

Assuming the negative feedback is enabled by the complementary clock $\overline{CLK}$ and non-complementary clock being low and high, respectively, and turning on PMOS FET M53 and NMOS FET M54, the negative feedback operates as follows:

If the logic voltages at node pn1 is low and at node pn2 is high, and radiation or noise tends to increase the low voltage at node pn1, the high voltage at node pn2 maintains NMOS FET M55 of the negative feedback circuit 1026 turned on, which couples the lower voltage rail Vss to node pn1. The coupling of the lower voltage rail Vss to node pn1 by NMOS FET M55 fights or counters the radiation or noise attempting to pull up node pn1. Thus, the non-noisy high logic voltage at node pn2 turning on NMOS FET M55 operates as an anchor to maintain the voltage at node pn1 low even when affected by radiation and noise.

Similarly, if the logic voltages at node pn1 is high and at node pn2 is low, and radiation or noise tends to decrease the high voltage at node pn1, the low voltage at node pn2 maintains PMOS FET M52 of the negative feedback circuit 1026 turned on, which couples the upper voltage rail Vdd to node pn1. The coupling of the upper voltage rail Vdd to node pn1 by PMOS FET M52 fights or counters the radiation or noise attempting to pull down node pn1. Thus, the non-noisy low logic voltage at node pn2 turning on PMOS FET M52 operates as an anchor to maintain the voltage node pn1 high even when affected by radiation and noise.

Likewise, if the logic voltages at node pn1 is low and at node pn2 is high, and radiation or noise tends to decrease the high voltage at node pn2, the low voltage at node pn1 maintains PMOS FET M50 of the negative feedback circuit 1028 turned on, which couples the upper voltage rail Vdd to node pn2. The coupling of the upper voltage rail Vdd to node pn2 by PMOS FET M50 fights or counters the radiation or noise attempting to pull down node pn2. Thus, the non-noisy logic low voltage at node pn1 turning on PMOS FET M50 operates as an anchor to maintain the voltage node pn2 high even when affected by radiation and noise.

Similarly, if the logic voltages at node pn1 is high and at node pn2 is low, and radiation or noise tends to increase the low voltage at node pn2, the high voltage at node pn1 maintains NMOS FET M51 of the negative feedback circuit 1028 turned on, which couples the lower voltage rail Vss to node pn2. The coupling of the lower voltage rail Vss to node pn2 by NMOS FET M51 fights or counters the radiation or noise attempting to pull up node pn2. Thus, the non-noisy high logic voltage at node pn1 turning on NMOS FET M51 operates as an anchor to maintain the voltage at node pn2 low even when affected by radiation and noise.

When the master latch 1020 is in transparent mode in response to the complementary clock $\overline{CLK}$ and non-complementary clock CLK being high and low, respectively, the PMOS FET M53 and NMOS FET M54 of the negative feedback circuit 1026 are turned off or gated. With regard to the clocked inverter 1024, the gating of the negative feedback operation provided by the negative feedback circuit 1028 is already built in by the clock operation with respect to PMOS FET M17 and NMOS FET M18. Thus, the gating of the negative feedback circuits 1026 and 1028 allows data (D) or scan (S) to be written into the master latch 1020 from the master clocked gate 1010 without the negative feedback fighting the data writing operation.

Figure 11:
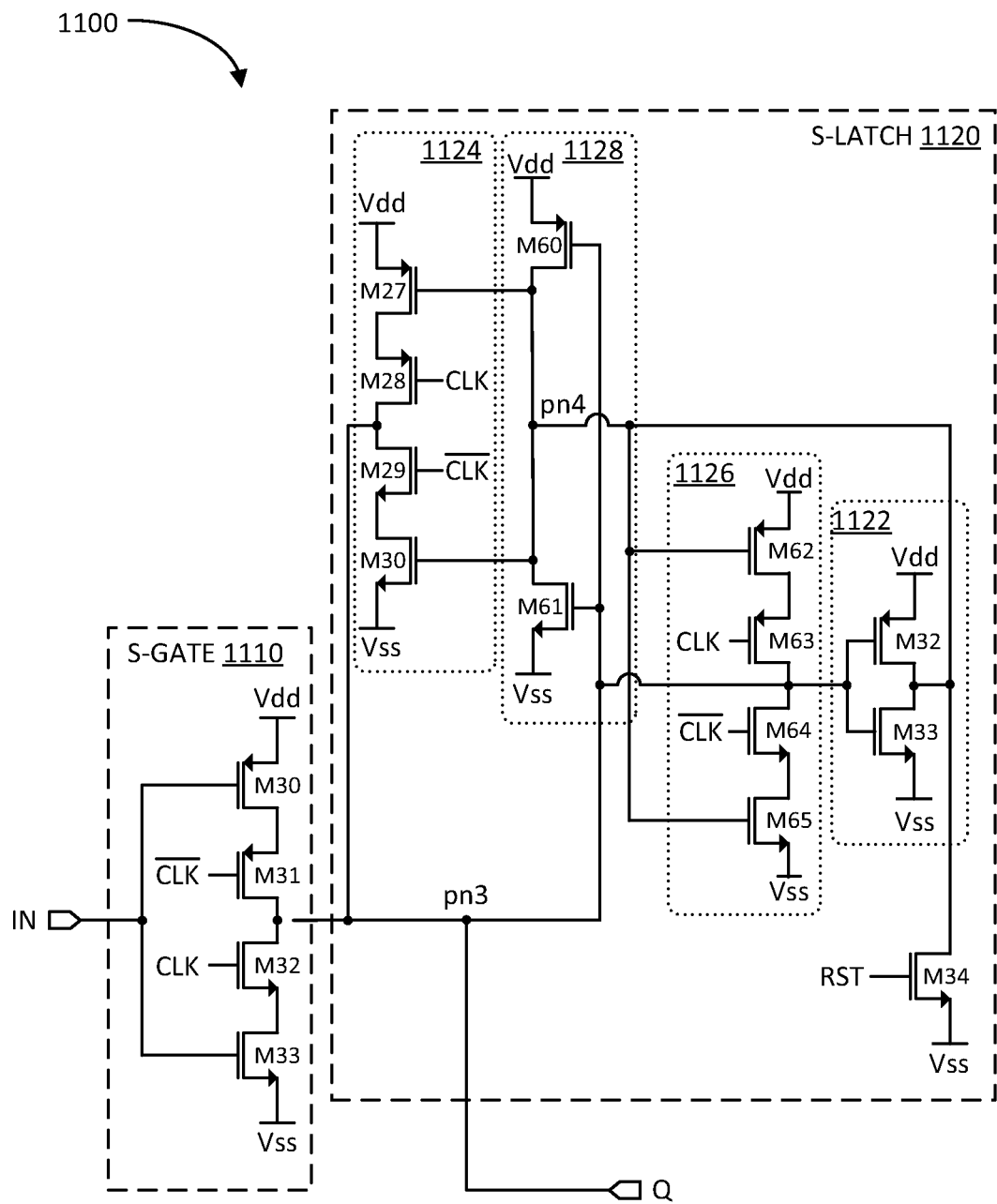
FIG. 11 illustrates a schematic diagram of another example slave-gate-latch circuit in accordance with another aspect of the disclosure.

FIG. 11 illustrates a schematic diagram of another example slave-gate-latch circuit 1100 in accordance with another aspect of the disclosure. The slave-gate-latch circuit 1100 is an example implementation of any of the slave-gate-latch circuits 150 and 340 previously discussed.

The slave-gate-latch circuit 1100 includes a slave clocked gate 1110, which is essentially the same as slave clocked gates 710 and 910 previously discussed. The slave-gate-latch circuit 1100 further includes a slave latch 1120 that is configured to provide substantially balanced transistor turn-on resistances $R_{ON}$ between its internal nodes and the voltage rails, but also includes negative feedback circuits for the internal nodes to further protect against SEUs due to terrestrial radiation and/or other noise.

The slave latch 1120 includes cross-coupled non-clocked inverter 1122 and clocked inverter 1124, which may be configured per cross-coupled non-clocked inverter 722 or 922 and clocked inverter 724 or 924 of slave latches 720 or 920, respectively. Regarding negative feedback, the slave latch 1120 includes a negative feedback circuit 1126 including an input coupled to node pn4 and an output coupled to node pn3. More specifically, the negative feedback circuit 1126 includes PMOS FETs M62-M63 coupled in series in that order between the upper voltage rail Vdd and node pn3, and NMOS FETs M64-M65 coupled in series in that order between node pn3 and the lower voltage rail Vss. The PMOS FET M62 and NMOS FET M65 include gates coupled to node pn4 for negative feedback purposes, and the PMOS FET M63 and NMOS FET M64 include gates to receive the non-complementary clock CLK and the complementary clock $\overline{CLK}$ for gating the negative feedback, respectively.

The slave latch 1120 further includes a negative feedback circuit 1128 including an input coupled to node pn3 and an output coupled to node pn4. More specifically, the negative feedback circuit 1128 includes a PMOS FET M60 coupled between the upper voltage rail and the node pn4, and an NMOS FET M61 coupled between node pn4 and the lower voltage rail Vss. The PMOS FET M60 and NMOS FET M61 include gates coupled to node pn3 for negative feedback purposes.

Assuming the negative feedback is enabled by the non-complementary clock CLK and the complementary clock $\overline{CLK}$ being low and high, respectively, and turning on PMOS FET M63 and NMOS FET M64, the negative feedback operates as follows:

If the logic voltages at node pn3 is low and at node pn4 is high, and radiation or noise tends to increase the low voltage at node pn3, the high voltage at node pn4 maintains NMOS FET M65 of the negative feedback circuit 1126 turned on, which couples the lower voltage rail Vss to node pn3. The coupling of the lower voltage rail Vss to node pn3 by NMOS FET M65 fights or counters the radiation or noise attempting to pull up node pn3. Thus, the non-noisy high logic voltage at node pn4 turning on NMOS FET M65 operates as an anchor to maintain the voltage at node pn3 low even when affected by radiation and noise.

Similarly, if the logic voltages at node pn3 is high and at node pn4 is low, and radiation or noise tends to decrease the high voltage at node pn3, the low voltage at node pn4 maintains PMOS FET M62 of the negative feedback circuit 1126 turned on, which couples the upper voltage rail Vdd to node pn3. The coupling of the upper voltage rail Vdd to node pn3 by PMOS FET M62 fights or counters the radiation or noise attempting to pull down node pn3. Thus, the non-noisy low logic voltage at node pn4 turning on PMOS FET M62 operates as an anchor to maintain the voltage node pn3 high even when affected by radiation and noise.

Likewise, if the logic voltages at node pn3 is low and at node pn4 is high, and radiation or noise tends to decrease the high voltage at node pn4, the low voltage at node pn3 maintains PMOS FET M60 of the negative feedback circuit 1128 turned on, which couples the upper voltage rail Vdd to node pn4. The coupling of the upper voltage rail Vdd to node pn4 by PMOS FET M60 fights or counters the radiation or noise attempting to pull down node pn4. Thus, the non-noisy logic low voltage at node pn3 turning on PMOS FET M60 operates as an anchor to maintain the voltage node pn4 high even when affected by radiation and noise.

Similarly, if the logic voltages at node pn3 is high and at node pn4 is low, and radiation or noise tends to increase the low voltage at node pn4, the high voltage at node pn3 maintains NMOS FET M61 of the negative feedback circuit 1128 turned on, which couples the lower voltage rail Vss to node pn4. The coupling of the lower voltage rail Vss to node pn4 by NMOS FET M61 fights or counters the radiation or noise attempting to pull up node pn4. Thus, the non-noisy high logic voltage at node pn3 turning on NMOS FET M61 operates as an anchor to maintain the voltage at node pn4 low even when affected by radiation and noise.

When the slave latch 1120 is in transparent mode in response to the non-complementary clock CLK and complementary clock $\overline{CLK}$ being high and low, respectively, the PMOS FET M63 and NMOS FET M64 of the negative feedback circuit 1126 are turned off or gated. With regard to the clocked inverter 1124, the gating of the negative feedback operation provided by the negative feedback circuit 1128 is already built in by the clock operation with respect to PMOS FET M28 and NMOS FET M29. Thus, the gating of the negative feedback circuits 1126 and 1128 allows data (D) or scan (S) to be written into the slave latch 1120 from the slave clocked gate 540 without the negative feedback fighting the data writing operation.

It shall be understood that the concepts described herein may be independently implemented or combined in a master-gate-latch circuit or slave-gate-latch circuit. For example, any of these devices may independently implement the balanced radiation tolerant nodes, the negative feedback, and the gated negative feedback as discussed. Alternatively, a master-gate-latch or slave-gate-latch may combine in any manner the balanced radiation tolerant nodes, the negative feedback, and the gated negative feedback.

Figure 12:
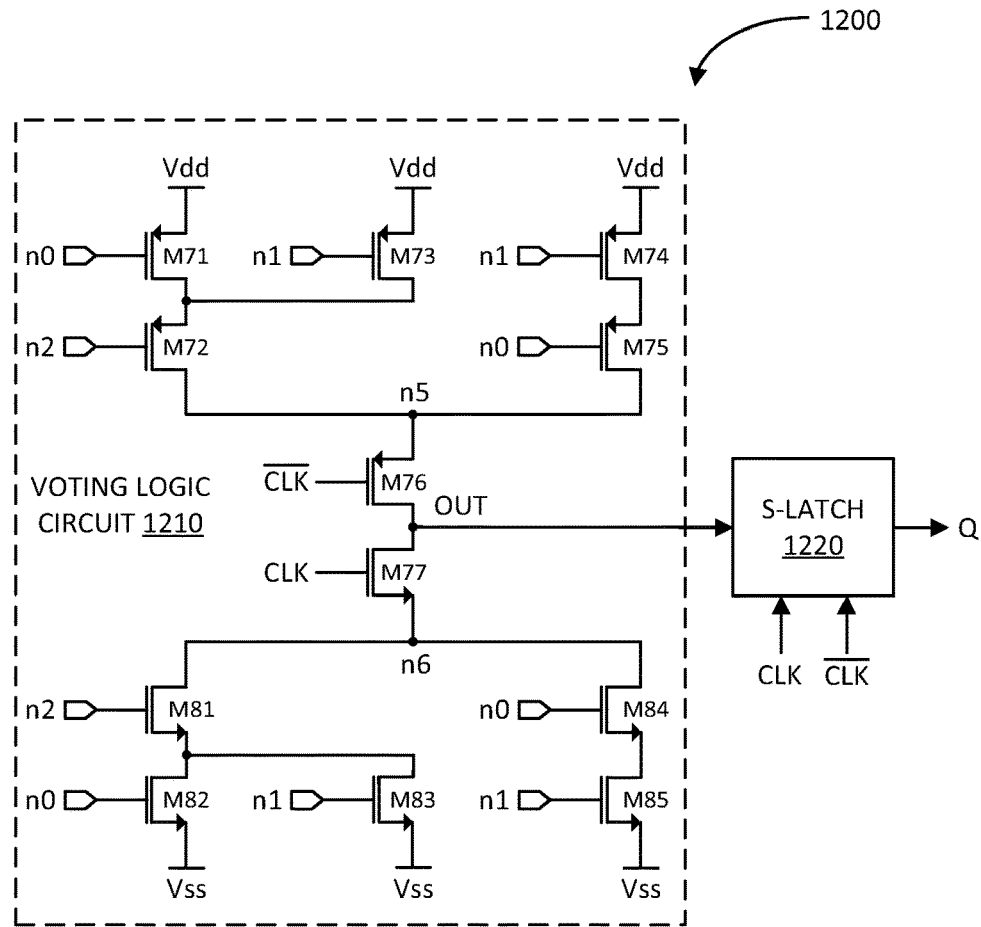
FIG. 12 illustrates a schematic diagram of an example fused voting logic and slave latch circuit in accordance with another aspect of the disclosure.

FIG. 12 illustrates a schematic diagram of an example fused voting logic and slave latch circuit 1200 in accordance with another aspect of the disclosure. The fused voting logic and slave latch circuit 1200 may be a detailed implementation of the voting logic circuit 330 and the slave latch 340. In the fused circuit 1200, a voting logic circuit, in addition to performing the voting operation based on the input signals, the voltage logic circuit also performs the function of gating the data, similar to any of the slave clocked gates 160, 710, 910, and 1110 described herein. Thus, there is no need for an additional slave clocked gate associated with a slave latch in the fused circuit 1200.

More specifically, the fused voting logic and slave latch circuit 1200 includes a voting logic circuit 1210 and a slave latch 1220. The voting logic circuit 1210 includes PMOS FETs M71-M72 coupled in series in that order between an upper voltage rail Vdd and a node n5, PMOS FET M73 coupled in parallel with PMOS FET M71 (between the upper voltage rail Vdd and the node between PMOS FETs M71-M72), and PMOS FETs M74-M75 coupled in series in that order between the upper voltage rail Vdd and node n5. The PMOS FETs M71-M75 include gates coupled to nodes n0, n2, n1, n1, and n0 as indicated in TMR flip-flop 300, respectively.

The voting logic circuit 1210 further includes NMOS FETs M81-M82 coupled in series in that order between a node n6 and a lower voltage rail Vss, NMOS FET M83 coupled in parallel with NMOS FET M82 (between the node between NMOS FETs M81-M82 and the lower voltage rail Vss), and NMOS FETs M84-M85 coupled in series in that order between node n6 and the lower voltage rail Vss. The NMOS FETs M81-M85 include gates coupled to nodes n2, n0, n1, n0, and n1 as indicated in TMR flip-flop 300, respectively.

For performing the gating operation, similar to a slave clocked gate, the voting logic circuit 1210 further includes a PMOS FET M76 and an NMOS FET M77 coupled in series in that order between nodes n5 and n6. The PMOS FET M76 and the NMOS FET M77 include gates to receive the complementary clock $\overline{CLK}$ and non-complementary clock CLK, respectively. The voting logic circuit 1210 includes an output between the drains of the PMOS FET M76 and the NMOS FET M77.

The slave latch 1220 includes an input coupled to the output of the voting logic circuit 1210. The slave latch 1220 may be configured per any of the slave latches described herein, such as slave latch 170, 720, 920, and 1120. Accordingly, the slave latch 1220 includes inputs to receive the non-complementary clock CLK and the complementary clock $\overline{CLK}$. The slave latch 1220 includes an output to produce an output digital signal Q.

In operation, when the complementary clock $\overline{CLK}$ and non-complementary clock CLK are logic high and low, respectively, the PMOS FET M76 and NMOS FET M77 are turned off; and thus, the voting logic circuit 1210 is disabled or tristated, similar to a slave clocked gate. Also, when the complementary clock $\overline{CLK}$ and non-complementary clock CLK are logic high and low, respectively, the slave latch 1220 is in opaque mode to latch the output digital signal Q.

When the complementary clock $\overline{CLK}$ and non-complementary clock CLK are logic low and high, respectively, the PMOS FET M76 and NMOS FET M77 are turned on; thus, the voting logic circuit 1210 performs the voting logic operation. As an example, if the logic levels at nodes n0, n1, and n2 are all logic high, the PMOS FETs M71-M75 are all turned off, and the NMOS FETs M81-M85 are all turned on. Thus, the output of the voting logic circuit 1210 is a logic low, which is the inverted logic level of the majority of the logic levels at nodes n0, n1, and n2. Similarly, if the logic levels at nodes n0, n1, and n2 are all logic low, the PMOS FETs M71-M75 are all turned on, and the NMOS FETs M81-M85 are all turned off. Thus, the output of the voting logic circuit 1210 is a logic high, which is the inverted logic level of the majority of the logic levels at nodes n0, n1, and n2.

If two of the logic levels at nodes n0, n1, and n2 are logic high, and the other is logic low, one of the transistors in each of the three (3) current paths (M71-M72, M73-M72, and M74-M75) between the upper voltage rail Vdd and node n5 is turned off; and two transistors in one of the three (3) current paths (M81-M82, M81-M83, and M84-M85) between node n6 and the lower voltage rail Vss is turned on. Thus, the output of the voting logic circuit 1210 is a logic low, which is the inverted logic level of the majority of the logic levels at nodes n0, n1, and n2.

Similarly, if two of the logic levels at nodes n0, n1, and n2 are logic low, and the other is logic high, two of the transistors in one of the three (3) current paths (M71-M72, M73-M72, and M74-M75) between the upper voltage rail Vdd and node n5 is turned on; and one of the transistors in each of the three (3) current paths (M81-M82, M81-M83, and M84-M85) between node n6 and the lower voltage rail Vss is turned off. Thus, the output of the voting logic circuit 1210 is a logic high, which is the inverted logic level of the majority of the logic levels at nodes n0, n1, and n2. When the complementary clock $\overline{CLK}$ and non-complementary clock CLK are logic low and high, respectively, the slave latch 1220 is in transparent mode to receive the digital signal from the voting logic circuit 1210.

Figure 13:
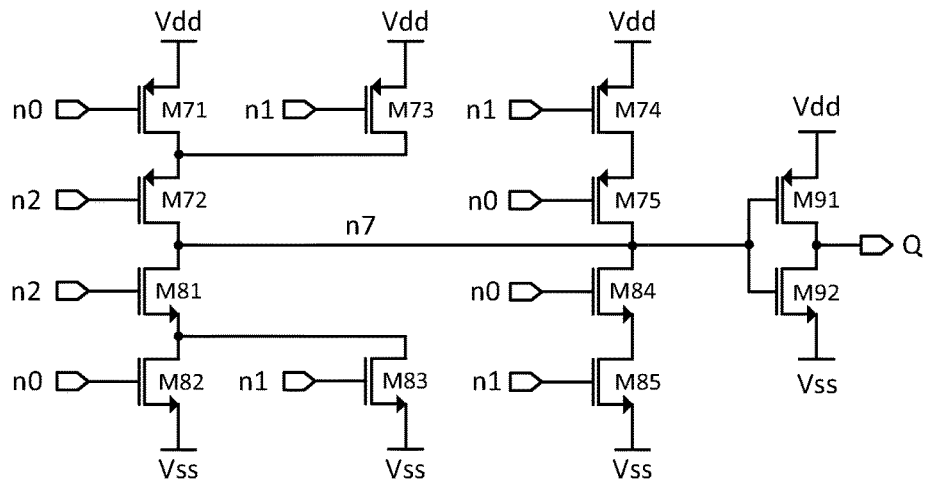
FIG. 13 illustrates a schematic diagram of an example voting logic circuit in accordance with another aspect of the disclosure.

FIG. 13 illustrates a schematic diagram of an example voting logic circuit 1300 in accordance with another aspect of the disclosure. The voting logic circuit 1300 may be a detailed implementation of voting logic circuit 430 of TMR flip-flop 400. The voting logic circuit 1300, without an output inverter, may be a detailed implementation of the voting logic circuit 330 for the non-fused version of the voting logic circuit 330 and slave-gate-latch circuit 340, as the slave-gate-latch circuit 340 performs the inversion operation of the output inverter.

More specifically, the voting logic circuit 1300 includes PMOS FETs M71-M72 coupled in series in that order between an upper voltage rail Vdd and a node n7, PMOS FET M73 coupled in parallel with PMOS FET M71 (between the upper voltage rail Vdd and the node between PMOS FETs M71-M72), and PMOS FETs M74-M75 coupled in series in that order between the upper voltage rail Vdd and node n7. The PMOS FETs M71-M75 include gates coupled to nodes n0, n2, n1, n1, and n0 as indicated in TMR flip-flop 300 or 400, respectively.

The voting logic circuit 1300 further includes NMOS FETs M81-M82 coupled in series in that order between node n7 and a lower voltage rail Vss, NMOS FET M83 coupled in parallel with NMOS FET M82 (between the node between NMOS FETs M81-M82 and the lower voltage rail Vss), and NMOS FETs M84-M85 coupled in series in that order between node n7 and the lower voltage rail Vss. The NMOS FETs M81-M85 include gates coupled to nodes n2, n0, n1, n0, and n1 as indicated in TMR flip-flop 300 or 400, respectively.

The voting logic circuit 1300 may further includes an output inverter including PMOS FET M91 and NMOS FET M92 coupled in series between the upper voltage rail Vdd and the lower voltage rail Vss. The PMOS FET M91 and NMOS FET M92 include gates coupled together (serving as the input of the inverter) coupled to node n7, and drains coupled together to produce the output signal Q. As mentioned, the output inverter M91/M192 is present in voting logic circuit 430, but need not be present in in non-fused version of the voting logic circuit 330.

In operation, if the logic levels at nodes n0, n1, and n2 are all logic high, the PMOS FETs M71-M75 are all turned off, and the NMOS FETs M81-M85 are all turned on. Thus, node n7 is at a logic low, and the inverter M91/M92 inverts the logic low to generate the output digital signal Q as a logic high, which agrees with the majority of the logic levels at nodes n0, n1, and n2. Similarly, if the logic levels at nodes n0, n1, and n2 are all logic low, the PMOS FETs M71-M75 are all turned on, and the NMOS FETs M81-M85 are all turned off. Thus, node n7 is at a logic high, and the inverter M91/M92 inverts the logic high to generate the output digital signal Q as a logic low, which agrees with the majority of the logic levels at nodes n0, n1, and n2.

If two of the logic levels at nodes n0, n1, and n2 are logic high, and the other is logic low, one of the transistors in each of the three (3) current paths (M71-M72, M73-M72, and M74-M75) between the upper voltage rail Vdd and node n7 is turned off; and two transistors in one of the three (3) current paths (M81-M82, M81-M83, and M84-M85) between node n7 and the lower voltage rail Vss is turned on. Thus, node n7 is at a logic low, and the inverter M91/M92 inverts the logic low to generate the output digital signal Q as a logic high, which agrees with the majority of the logic levels at nodes n0, n1, and n2.

Similarly, if two of the logic levels at nodes n0, n1, and n2 are logic low, and the other is logic high, two of the transistors in one of the three (3) current paths (M71-M72, M73-M72, and M74-M75) between the upper voltage rail Vdd and node n7 is turned on; and one of the transistors in each of the three (3) current paths (M81-M82, M81-M83, and M84-M85) between node n7 and the lower voltage rail Vss is turned off. Thus, node n7 is at a logic high, and the inverter M91/M92) inverts the logic high to generate the output digital signal Q as a logic low, which agrees with the majority of the logic levels at nodes n0, n1, and n2.

Figure 14:
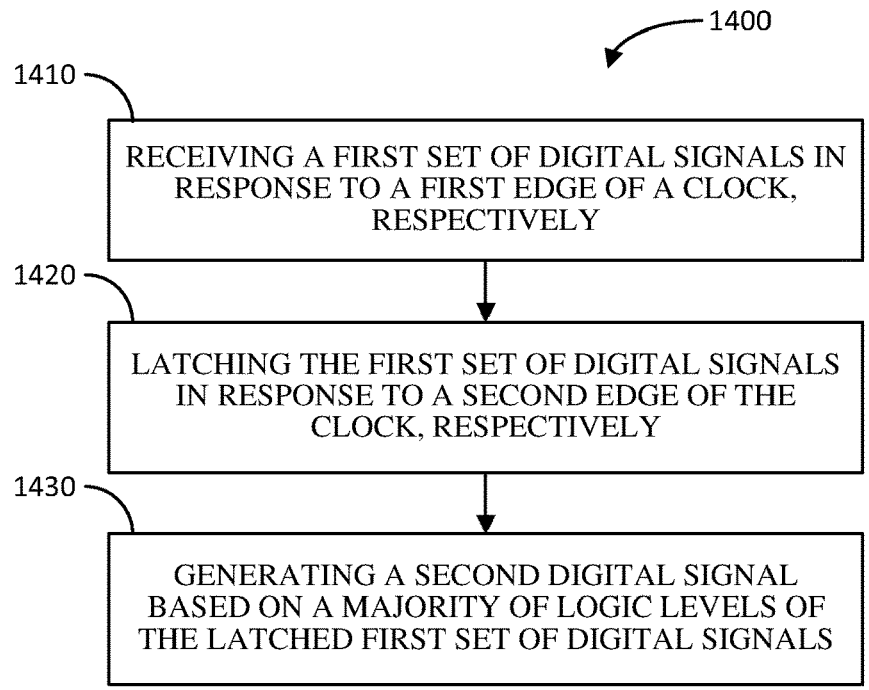
FIG. 14 illustrates a flow diagram of an example method of synchronously propagating a digital signal in accordance with another aspect of the disclosure.

FIG. 14 illustrates a flow diagram of an example method 1400 of synchronously propagating a digital signal in accordance with another aspect of the disclosure. The method 1400 includes receiving a first set of digital signals in response to a first edge of a clock, respectively (block 1410). The method 1400 further includes latching the first set of digital signals in response to a second edge of the clock, respectively (block 1420). Additionally, the method 1400 includes generating a second digital signal based on a majority of logic levels of the latched first set of digital signals (block 1430).

Figure 15:
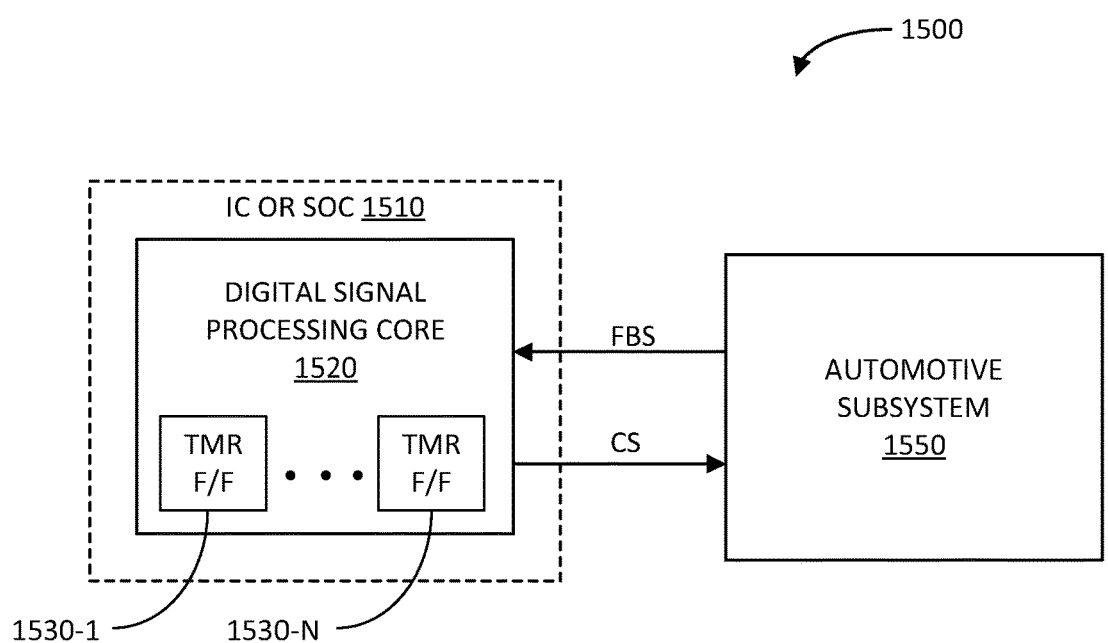
FIG. 15 illustrates a block diagram of an example vehicle safety system in accordance with another aspect of the disclosure.

FIG. 15 illustrates a block diagram of an example vehicle safety system 1500 in accordance with another aspect of the disclosure. In this example, the vehicle safety system 1500 pertains to an automotive system, but it shall be understood that other types of system may employ of the various TMR flip-flops described herein.

The vehicle safety system 1500 includes an integrated circuit (IC) 1510, which may be configured as a system on chip (SOC). The IC 1510 includes a digital signal processing core 1520, which, in turn, includes a set of triple modulator redundancy (TMR) flip-flops (F/F) 1530-1 to 1530-N. Each of the set of TMR flip-flop 1530-1 to 1530-N may be configured per TMR flip-flop 300 or 400, or any combination thereof as previously discussed.

The vehicle safety system 1500 may further include an automotive subsystem 1550, which, for example, may be a cruise control subsystem, a forward collision warning (FCW) subsystem, lane departure warning (LDW) subsystem, blind spot detection (BSD) warning subsystem, adaptive cruise control (ACC) subsystem, lane keep assist (LKA) subsystem, ACC with lane keeping subsystem, traffic jam assist subsystem, full highway autopilot subsystem, full urban autopilot subsystem, robo-taxi/shuttle subsystem, autonomous delivery fleet subsystem, or other.

Using a first subset of the TMR flip-flops 1530-1 to 1530-N, the digital signal processing core 1520 may generate and provide a control signal (CS) to control an operation of the automotive subsystem 1550. Using a second subset of TMR flip-flops 1530-1 to 1530-N, the digital signal processing core 1520 may receive and process a feedback signal (FBS) from the automotive subsystem 1550. The digital signal processing core 1520 may generate the control signal (CS) and/or perform other functions based on the feedback signal (FBS). Being configured per TMR flip-flop 300 and/or 400, the set of TMR flip-flops 1530-1 to 1530-N are more resilient to terrestrial radiation and/or other types of noise, ensuring that the vehicle safety system 1500 meets the FIT requirements specified by the relevant standard.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a set of master-gate-latch circuits including a first set of inputs to receive a first digital signal, a second set of inputs to receive a clock, and a set of outputs to generate a set of output digital signals, respectively;
   a voting logic circuit including a set of inputs coupled to the set of outputs of the set of master-gate-latch circuits, respectively, and an output to generate a second digital signal based on a majority of logic levels of the output digital signals, respectively; and
   a slave latch circuit including an input coupled to the output of the voting logic circuit.

2. The apparatus of claim 1, wherein each of the master-gate-latch circuits comprises:
   a master clocked gate including a corresponding one of the first set of inputs, and a corresponding one of the second set of inputs; and a master latch including a corresponding first node coupled to an output of the master clocked gate, and the corresponding one of the second set of inputs, wherein the first node serves as a corresponding one of the set of outputs of the corresponding master-gate-latch circuit.

3. The apparatus of claim 2, wherein the clock comprises a non-complementary clock and a complementary clock, and wherein the master clocked gate comprises:
   a first field effect transistor (FET) including a gate to receive a reset signal;
   a second FET including a gate to receive the first digital signal;
   a third FET including a gate to receive the non-complementary clock;
   a fourth FET including a gate to receive the complementary clock; and
   a fifth FET including a gate to receive the first digital signal, wherein the first, second, third, fourth, and fifth FETs are coupled in series between a first voltage rail and a second voltage rail, and wherein the output of the master clocked gate is at a node between the third and fourth FETs.

4. The apparatus of claim 2, wherein the master latch comprises:
   a non-clocked inverter including an input coupled to the first node and an output coupled to a second node; and
   a clocked inverter including an input coupled to the second node, and an output coupled to the first node.

5. The apparatus of claim 4, wherein the non-clocked inverter comprises:
   a first field effect transistor (FET) including a gate coupled to the first node, and a drain coupled to the second node; and
   a second FET including a gate coupled to the first node, and a drain coupled to the second node, wherein the first and second FETs are coupled in series between a first voltage rail and a second voltage rail.

6. The apparatus of claim 5, wherein the clock comprises a non-complementary clock and a complementary clock, and wherein the clocked inverter comprises:
   a third FET including a gate coupled to the second node;
   a fourth FET including a gate to receive the complementary clock;
   a fifth FET including a gate to receive the non-complementary clock; and
   a sixth FET including a gate coupled to the second node, wherein the third and fourth FETs are coupled in series between the first voltage rail and the first node, and the fifth and sixth FETs are coupled in series between the first node and the second voltage rail.

7. The apparatus of claim 6, wherein each of the third, fourth, fifth, and sixth FETs is configured with a first effective channel width to length ratio (W/L), and wherein each of the first and second FETs is configured with a second effective W/L different than the first W/L.

8. The apparatus of claim 7, wherein the first effective W/L is substantially two times the second effective W/L.

9. The apparatus of claim 6, wherein the clocked inverter further comprises a seventh FET coupled between the first voltage rail and the third FET, wherein the seventh FET includes a gate to receive a reset signal.

10. The apparatus of claim 4, wherein the master latch further comprises a field effect transistor (FET) coupled between the first node and a voltage rail, wherein the FET includes a gate to receive a reset signal.

11. The apparatus of claim 4, wherein the master latch further comprises:
    a first negative feedback circuit including an input coupled to the second node, and an output coupled to the first node; and
    a second negative feedback circuit including an input coupled to the first node, and an output coupled to the second node.

12. The apparatus of claim 11, wherein the clock comprises a non-complementary clock and a complementary clock, and wherein the first negative feedback circuit comprises:
    a first field effect transistor (FET) including a gate coupled to the second node;
    a second FET including a gate to receive the complementary clock;
    a third FET including a gate to receive the non-complementary clock; and
    a fourth FET including a gate coupled to the second node, wherein the first, and second FETs are coupled in series between a first voltage rail and the first node, wherein the third and fourth FETs are coupled in series between the first node and a second voltage rail.

13. The apparatus of claim 11, wherein the second negative feedback circuit comprises:
    a first field effect transistor (FET) coupled between a first voltage rail and the second node, wherein the first FET includes a gate coupled to the first node; and
    a second FET coupled between the second node and a second voltage rail, wherein the second FET includes a gate coupled to the first node.

14. The apparatus of claim 1, wherein the voting logic circuit comprises:
    a first field effect transistor (FET) including a gate coupled to a first one of the set of outputs of the set of master-gate-latch circuits;
    a second FET including a gate coupled to a second one of the set of outputs of the set of master-gate-latch circuits, wherein the first and second FETs are coupled in series between a first voltage rail and a first node;
    a third FET including a gate coupled to a third one of the set of outputs of the set of master-gate-latch circuits, wherein the third FET is coupled between the first voltage rail and a second node between the first and second FETs;
    a fourth FET including a gate coupled to the third one of the set of outputs of the set of master-gate-latch circuits;
    a fifth FET including a gate coupled to the first one of the set of outputs of the set of master-gate-latch circuits, wherein the fourth and fifth FETs are coupled between the first voltage rail and the first node;
    a sixth FET including a gate coupled to the second one of the set of outputs of the set of master-gate-latch circuits;
    a seventh FET including a gate coupled to the first one of the set of outputs of the set of master-gate-latch circuits, wherein the sixth and seventh FETs are coupled in series between the first node and a second voltage rail;
    an eighth FET including a gate coupled to the third one of the set of outputs of the set of master-gate-latch circuits, wherein the eighth FET is coupled between a third node between the seventh and eighth FETs and the second voltage rail;
    a ninth FET including a gate coupled to the first one of the set of outputs of the set of master-gate-latch circuits;

a tenth FET including a gate coupled to the third one of the set of outputs of the set of master-gate-latch circuits, wherein the ninth and tenth FETs are coupled between the first node and the second voltage rail; and an inverter including an input coupled to the first node, and an output serving as the output of the voting logic circuit.

15. The apparatus of claim 1, wherein the slave latch includes an input to receive the clock.

16. The apparatus of claim 15, wherein the slave latch comprises:

a non-clocked inverter including an input coupled to the first node and an output coupled to a second node; and a clocked inverter including an input coupled to the second node, and an output coupled to the first node.

17. The apparatus of claim 16, wherein the non-clocked inverter comprises:

a first field effect transistor (FET) including a gate coupled to the first node, and a drain coupled to the second node; and a second FET including a gate coupled to the first node, and a drain coupled to the second node, wherein the first and second FETs are coupled in series between a first voltage rail and a second voltage rail.

18. The apparatus of claim 17, wherein the clock comprises a non-complementary clock and a complementary clock, and wherein the clocked inverter comprises:

a third FET including a gate coupled to the second node;

a fourth FET including a gate to receive the non-complementary clock;

a fifth FET including a gate to receive the complementary clock; and a sixth FET including a gate coupled to the second node, wherein the third and fourth FETs are coupled in series between the first voltage rail and the first node, wherein the fifth and sixth FETs are coupled in series between the first node and the second voltage rail.

19. The apparatus of claim 18, wherein each of the third, fourth, fifth, and sixth FETs is configured with a first effective channel width to length ratio (W/L), and wherein each of the first and second FETs is configured with a second effective W/L different than the first W/L.

20. The apparatus of claim 19, wherein the first effective W/L is substantially two times the second effective W/L.

21. The apparatus of claim 18, wherein the clocked inverter further comprises a seventh FET coupled between the first voltage rail and the third FET, wherein the seventh FET includes a gate to receive a reset signal.

22. The apparatus of claim 16, wherein the slave latch further comprises a field effect transistor (FET) coupled between the second node and a voltage rail, wherein the FET includes a gate to receive a reset signal.

23. The apparatus of claim 16, wherein the slave latch further comprises:

a first negative feedback circuit including an input coupled to the second node, and an output coupled to the first node; and a second negative feedback circuit including an input coupled to the first node, and an output coupled to the second node.

24. The apparatus of claim 23, wherein the clock comprises a non-complementary clock and a complementary clock, and wherein the first negative feedback circuit comprises:

a first field effect transistor (FET) including a gate coupled to the second node;

a second FET including a gate to receive the non-complementary clock;

a third FET including a gate to receive the complementary clock; and a fourth FET including a gate coupled to the second node, wherein the first and second FETs are coupled in series between a first voltage rail and the first node, and wherein the third and fourth FETs are coupled in series between the first node and a second voltage rail.

25. The apparatus of claim 23, wherein the second negative feedback circuit comprises:

a first field effect transistor (FET) coupled between a first voltage rail and the second node, wherein the first FET includes a gate coupled to the first node; and a second FET coupled between the second node and a second voltage rail, wherein the second FET includes a gate coupled to the first node.

26. The apparatus of claim 16, wherein the clock comprises a non-complementary clock and a complementary clock, and wherein the voting logic circuit comprises:

a first field effect transistor (FET) including a gate coupled to a first one of the set of outputs of the set of master-gate-latch circuits;

a second FET including a gate coupled to a second one of the set of outputs of the set of master-gate-latch circuits, wherein the first and second FETs are coupled in series between a first voltage rail and a second node;

a third FET including a gate coupled to a third one of the set of outputs of the set of master-gate-latch circuits, wherein the third FET is coupled between the first voltage rail and a third node between the first and second FETs;

a fourth FET including a gate coupled to the third one of the set of outputs of the set of master-gate-latch circuits;

a fifth FET including a gate coupled to the first one of the set of outputs of the set of master-gate-latch circuits, wherein the fourth and fifth FETs are coupled between the first voltage rail and the second node;

a sixth FET including a gate coupled to the second one of the set of outputs of the set of master-gate-latch circuits;

a seventh FET including a gate coupled to the first one of the set of outputs of the set of master-gate-latch circuits, wherein the sixth and seventh FETs are coupled in series between the fourth node and a second voltage rail;

an eighth FET including a gate coupled to the third one of the set of outputs of the set of master-gate-latch circuits, wherein the eighth FET is coupled between a fifth node between the sixth and seventh FETs and the second voltage rail;

a ninth FET including a gate coupled to the first one of the set of outputs of the set of master-gate-latch circuits;

a tenth FET including a gate coupled to the third one of the set of outputs of the set of master-gate-latch circuits, wherein the ninth and tenth FETs are coupled between the fourth node and the second voltage rail;

an eleventh FET including a gate to receive the complementary clock; and a twelfth FET including a gate to receive the non-complementary clock, wherein the eleventh and twelfth FETs are coupled in series between the second and fourth node.

27. The apparatus of claim 1, further comprising a design for testability (DFT) circuit including a set of inputs coupled to the set of outputs of the set of master-gate-latch circuits, and a set of outputs coupled to the set of inputs of the voting logic circuit, respectively.

28. The apparatus of claim 27, wherein the DFT circuit comprises:
    a first NOR gate including a first input among the set of inputs to receive a shift signal, a second input among the set of inputs coupled to a first one of the set of outputs of the set of master-gate-latch circuits, and an output among the set of outputs coupled to a first one of the set of inputs of the voting logic circuit; and
    a NAND gate including a first input among the set of inputs to receive a complementary shift signal, a second input among the set of inputs coupled to a second one of the set of outputs of the set of master-gate-latch circuits, and an output among the set of outputs coupled to a second one of the set of inputs of the voting logic circuit.

29. The apparatus of claim 28, wherein the DFT circuit further comprises a second NOR gate including a first input among the set of inputs to receive a second shift signal, a second input among the set of inputs coupled to a third one of the set of outputs of the set of master-gate-latch circuits, and an output among the set of outputs coupled to a third one of the set of inputs of the voting logic circuit.

30. The apparatus of claim 1, further comprising a set of multiplexers comprising:
    a first set of inputs to receive an application data signal, respectively;
    a second set of inputs to receive a set of test signals, respectively;
    a third set of inputs to receive a set of shift signals, respectively; and
    a set of outputs coupled to the first set of inputs of the set of master-gate-latch circuits, respectively.

31. The apparatus of claim 1, further comprising a pulse generator including an output coupled to the second set of inputs of the set of master-gate-latch circuits, wherein the clock comprises a pulse clock with a duty cycle of less than 50 percent.

32. An apparatus, comprising:
    a set of master-gate-latch circuits configured to:
        receive a first set of digital signals in response to a first edge of a clock, respectively; and
        latch the first set of digital signals in response to a second edge of the clock, respectively;
    a voting logic circuit configured to:
        receive the latched first set of digital signals; and
        generate a second digital signal based on a majority of logic levels of the latched first set of digital signals; and
    a slave latch configured to:
        receive the second digital signal in response to the second edge of the clock; and
        latch the second digital signal in response to the first edge of the clock.

33. The apparatus of claim 32, wherein the voting logic circuit is configured to generate the second digital signal in response to the second edge of the clock.

34. The apparatus of claim 32, further comprising a pulse generator configured to generate the clock as a pulse clock with a duty cycle of less than 50 percent.

35. The apparatus of claim 32, further comprising a design for testability (DFT) circuit configured to provide a set of test digital signals to the voting logic circuit to allow the voting logic circuit to toggle the second digital signal in response to a toggling of one of the latched first set of digital signals in response to the first edge and one or more other edges of the clock.

36. A method, comprising:
    receiving a first set of digital signals in response to a first edge of a clock, respectively;
    latching the first set of digital signals in response to a second edge of the clock, respectively;
    generating a second digital signal based on a majority of logic levels of the latched first set of digital signals;
    receiving the second digital signal in response to the second edge of the clock; and
    latching the second digital signal in response to the first edge of the clock.

37. The method of claim 36, wherein generating the second digital signal is in response to the second edge of the clock.

38. The method of claim 36, further comprising generating the clock as a pulse clock with a duty cycle of less than 50 percent.

39. The method of claim 36, further comprising providing a set of test digital signals to the voting logic circuit to allow the voting logic circuit to toggle the second digital signal in response to a toggling of one of the latched first set of digital signals in response to the first edge and one or more other edges of the clock.

* * * * *